(12) United States Patent
Ogawara et al.

(10) Patent No.: US 10,983,398 B2
(45) Date of Patent: Apr. 20, 2021

(54) METHOD FOR MANUFACTURING LIQUID CRYSTAL DISPLAY DEVICE AND PHOTOMASK

(71) Applicant: SAKAI DISPLAY PRODUCTS CORPORATION, Sakai (JP)

(72) Inventors: Naoto Ogawara, Sakai (JP); Kenichi Mukai, Sakai (JP); Mariko Nagai, Sakai (JP); Yoshitaka Okumoto, Sakai (JP); Akihiro Yamamoto, Sakai (JP); Kenichi Hyohdoh, Sakai (JP); Yasuhiro Azahara, Sakai (JP)

(73) Assignee: SAKAI DISPLAY PRODUCTS CORPORATION, Sakai (JP)

( * ) Notice: Subject to any disclaimer, the term of this patent is extended or adjusted under 35 U.S.C. 154(b) by 0 days.

(21) Appl. No.: 16/957,212

(22) PCT Filed: Jan. 19, 2018

(86) PCT No.: PCT/JP2018/001635
§ 371 (c)(1),
(2) Date: Jun. 23, 2020

(87) PCT Pub. No.: WO2019/142328
PCT Pub. Date: Jul. 25, 2019

(65) Prior Publication Data
US 2020/0393716 A1    Dec. 17, 2020

(51) Int. Cl.
*G02F 1/1337* (2006.01)

(52) U.S. Cl.
CPC .... *G02F 1/13378* (2013.01); *G02F 2201/123* (2013.01)

(58) Field of Classification Search
CPC .................................................. G02F 1/13378
See application file for complete search history.

(56) References Cited

U.S. PATENT DOCUMENTS

2009/0284703 A1    11/2009    Shoraku et al.

FOREIGN PATENT DOCUMENTS

| | | |
|---|---|---|
| JP | 2012-173641 A | 9/2012 |
| WO | 2006/132369 A1 | 12/2006 |

*Primary Examiner* — Joseph L Williams
(74) *Attorney, Agent, or Firm* — ScienBiziP, P.C.

(57) ABSTRACT

A manufacturing method for a liquid crystal display apparatus according to an embodiment of the present invention includes a step (A) of preparing a first substrate including a pixel electrode and a first photoalignment film that has not been subjected to an alignment treatment, and a step (B) of exposing a region of the first photoalignment film which is to serve as a first alignment region through a plurality of first photomasks, while transporting the prepared first substrate in a predetermined transport direction, the plurality of first photomasks including two or more first photomasks arranged in a second direction intersecting the transport direction. Each first photomask includes a plurality of pairs of a light-transmitting portion and a light-blocking portion. Each first photomask is designed so that in the step (B), on a side closer to one end of the first photomask, a boundary between the light-transmitting portion and the light-blocking portion is offset from a domain boundary toward the one end, and on a side closer to the other end of the first photomask, the boundary between the light-transmitting portion and the light-blocking portion is offset from the domain boundary toward the other end.

9 Claims, 13 Drawing Sheets

(a) ACTIVE MATRIX SUBSTRATE SIDE (b) COUNTER SUBSTRATE SIDE (c) LIQUID CRYSTAL LAYER (a) COMPARATIVE EXAMPLE (b) EXAMPLE (a) COMPARATIVE EXAMPLE (b) EXAMPLE (a) ACTIVE MATRIX SUBSTRATE SIDE (b) COUNTER SUBSTRATE SIDE (c) LIQUID CRYSTAL LAYER

METHOD FOR MANUFACTURING LIQUID CRYSTAL DISPLAY DEVICE AND PHOTOMASK

TECHNICAL FIELD

The present invention relates to methods for manufacturing a liquid crystal display apparatus. More particularly, the present invention relates to a method for manufacturing a liquid crystal display apparatus including a photoalignment film. The present invention also relates to a photomask used in manufacture of such a liquid crystal display apparatus.

BACKGROUND ART

Liquid crystal display apparatuses, the display characteristics of which have been improved, are being used in more and more applications such as a television set. The viewing angle characteristics of liquid crystal display apparatuses have been improved, but further improvements are desired. In particular, there is a strong demand for improvement of the viewing angle characteristics of a liquid crystal display apparatus employing a vertical alignment type liquid crystal layer (also called a "vertical alignment (VA) mode liquid crystal display apparatus").

At present, in VA mode liquid crystal display apparatuses used in large-size display apparatuses such as a television, the alignment division structure (multi-domain structure), in which a plurality of liquid crystal domains are formed in a pixel, is employed in order to improve the viewing angle characteristics. As a representative technique for forming the alignment division structure, the multi-domain vertical alignment (MVA) mode is known.

In the MVA mode, an alignment control structure is provided on the side facing the vertical alignment type liquid crystal layer of each of a pair of substrates facing each other with the vertical alignment type liquid crystal layer interposed therebetween, so that a plurality of liquid crystal domains (typically, four alignment directions) having different alignment directions (tilt directions) are formed in each pixel. As the alignment control structure, slits (openings) that are provided in electrodes or ribs (protrusion structures) are used. The alignment control structure exerts alignment control force from either side of the liquid crystal layer.

However, if slits or ribs are used, the linear shape of the slits or ribs leads to non-uniform alignment control force applied to liquid crystal molecules in the pixel, unlike the conventional twisted nematic (TN) mode, etc., in which pretilt directions are defined by alignment films. Therefore, a distribution of response speed occurs in the pixel.

In order to circumvent this problem, even in the VA mode liquid crystal display apparatus, the alignment division structure is preferably formed by defining pretilt directions using alignment films. Patent Document No. 1 discloses a liquid crystal display apparatus in which the alignment division structure is formed in such a manner.

In the liquid crystal display apparatus disclosed in Patent Document No. 1, a four-domain structure is formed by defining pretilt directions using alignment films. Specifically, when a voltage is applied to the liquid crystal layer, four liquid crystal domains are formed in a pixel. Such a four-domain structure is also simply called a 4D structure.

In addition, in the liquid crystal display apparatus disclosed in Patent Document No. 1, a pretilt direction defined by one of the pair of alignment films facing each other with the liquid crystal layer interposed therebetween is about 90° different from a pretilt direction defined by the other alignment film. Therefore, when a voltage is applied, liquid crystal molecules take twisted orientations. Thus, the VA mode in which twisted orientations of liquid crystal molecules are produced by a pair of vertical alignment films arranged so as to define orthogonal pretilt directions (alignment treatment directions) is also called a vertical alignment twisted nematic (or denoted as vertically aligned twisted nematic) (VATN) mode or a reverse twisted nematic (RTN) mode. As described above, in the liquid crystal display apparatus of Patent Document No. 1, the 4D structure is formed, and therefore, the display mode of the liquid crystal display apparatus of Patent Document No. 1 is also called a 4D-RTN mode.

As a specific technique of defining pretilt directions of liquid crystal molecules using alignment films, the photoalignment treatment is promising as described in Patent Document No. 2. The photoalignment treatment can be performed in a contactless manner, and therefore, unlike a rubbing treatment, there is no static electricity caused by friction, leading to an improvement in yield.

The photoalignment treatment is performed using a photomask and an exposure device. The size of the photomask has in recent years been increased with an increase in size of a substrate. Photomasks cost high, and therefore, an increase in size of a photomask leads to an increase in manufacturing cost. Under these circumstances, Patent Document No. 2 proposes an exposure device which performs scanning exposure using an array of small-size photomasks.

CITATION LIST

Patent Literature

Patent Document No. 1: International Publication WO2006/132369
Patent Document No. 2: Japanese Laid-Open Patent Publication No. 2012-173641

SUMMARY OF INVENTION

Technical Problem

The present inventors have extensively studied to find that when the photoalignment treatment is performed using an exposure device of the type disclosed in Patent Document No. 2, streak-shaped display irregularity (also hereinafter referred to as "streak irregularity") occurs in a completed liquid crystal display apparatus, likely leading to a decrease in display quality. It was also found that streak irregularity is more likely to occur in a liquid crystal display apparatus having high definition, i.e., in which each pixel has a small size.

With the above problem in mind, the present invention has been made. It is an object of the present invention to prevent or reduce the occurrence of streak-shaped display irregularity in a VA mode liquid crystal display apparatus in which the alignment division structure is formed by defining pretilt directions using photoalignment films.

Solution to Problem

A manufacturing method for a liquid crystal display apparatus according to an embodiment of the present invention is a manufacturing method for a liquid crystal display apparatus, wherein the liquid crystal display apparatus includes a plurality of pixels arranged in a matrix, a first and a second substrate facing each other, and a vertical alignment type liquid crystal layer provided between the first and second substrates, the first substrate includes a pixel electrode provided for each of the plurality of pixels, and a first photoalignment film provided between the pixel electrode and the liquid crystal layer, the second substrate includes a counter electrode facing the pixel electrode, and a second photoalignment film provided between the counter electrode and the liquid crystal layer, the plurality of pixels each include a plurality of liquid crystal domains having different reference alignment directions defined by the first and second photoalignment films, the plurality of liquid crystal domains include a first and a second liquid crystal domain adjacent to each other with a first domain boundary extending in parallel to a first direction interposed therebetween, the first photoalignment film includes a first and a second alignment region that define different pretilt directions in each of the plurality of pixels, and are adjacent to each other with the first domain boundary interposed therebetween, and the manufacturing method for the liquid crystal display apparatus comprises: a step (A) of preparing the first substrate including the pixel electrode and the first photoalignment film that has not been subjected to an alignment treatment; and a step (B) of exposing a region of the first photoalignment film which is to serve as the first alignment region through a plurality of first photomasks, while transporting the prepared first substrate in a predetermined transport direction, the plurality of first photomasks including two or more first photomasks arranged in a second direction intersecting the transport direction, wherein the plurality of first photomasks each include a plurality of pairs of a light-transmitting portion that transmits exposure light for exposing a region of the first photoalignment film which is to serve as the first alignment region, and a light-blocking portion that blocks light toward a region of the first photoalignment film which is to serve as the second alignment region, and the plurality of pairs are aligned in the second direction, and the plurality of first photomasks are each designed so that in the step (B), on a side closer to one end in the second direction of the first photomask, a boundary between the light-transmitting portion and the light-blocking portion is offset from the first domain boundary toward the one end, and on a side closer to the other end in the second direction of the first photomask, the boundary between the light-transmitting portion and the light-blocking portion is offset from the first domain boundary toward the other end.

A photomask according to an embodiment of the present invention is a photomask for use in an exposure step in a manufacturing method for a liquid crystal display apparatus, wherein the liquid crystal display apparatus includes a plurality of pixels arranged in a matrix, a first and a second substrate facing each other, and a vertical alignment type liquid crystal layer provided between the first and second substrates, the first substrate includes a pixel electrode provided for each of the plurality of pixels, and a first photoalignment film provided between the pixel electrode and the liquid crystal layer, the second substrate includes a counter electrode facing the pixel electrode, and a second photoalignment film provided between the counter electrode and the liquid crystal layer, the plurality of pixels each include a plurality of liquid crystal domains having different reference alignment directions defined by the first and second photoalignment films, the plurality of liquid crystal domains include a first and a second liquid crystal domain adjacent to each other with a first domain boundary extending in parallel to a first direction interposed therebetween, the first photoalignment film includes a first and a second alignment region that define different pretilt directions in each of the plurality of pixels, and are adjacent to each other with the first domain boundary interposed therebetween, and the exposing step includes exposing a region of the first photoalignment film which is to serve as the first alignment region through a plurality of photomasks, while transporting the first substrate in a predetermined transport direction, the plurality of photomasks including two or more photomasks arranged in a second direction intersecting the transport direction, the photomask comprises a plurality of pairs of a light-transmitting portion that transmits exposure light for exposing a region of the first photoalignment film which is to serve as the first alignment region, and a light-blocking portion that blocks light toward a region of the first photoalignment film which is to serve as the second alignment region, and the plurality of pairs are aligned in the second direction, and the photomask is designed so that in the exposure step, on a side closer to one end in the second direction of the photomask, a boundary between the light-transmitting portion and the light-blocking portion is offset from the first domain boundary toward the one end, and on a side closer to the other end in the second direction of the photomask, the boundary between the light-transmitting portion and the light-blocking portion is offset from the first domain boundary toward the other end.

Advantageous Effects of Invention

According to an embodiment of the present invention, in a VA mode liquid crystal display apparatus in which the alignment division structure is formed by defining pretilt directions using photoalignment films, the occurrence of streak-shaped display irregularity can be prevented or reduced.

BRIEF DESCRIPTION OF DRAWINGS

FIG. 11 is a diagram showing a position of a light-transmitting portion TR of a first photomask 51 in a step (first exposure step) of exposing a region of a first photoalignment film 12 that is to serve as a first alignment region 12a.

DESCRIPTION OF EMBODIMENTS

Description of Terms

Figure 1:
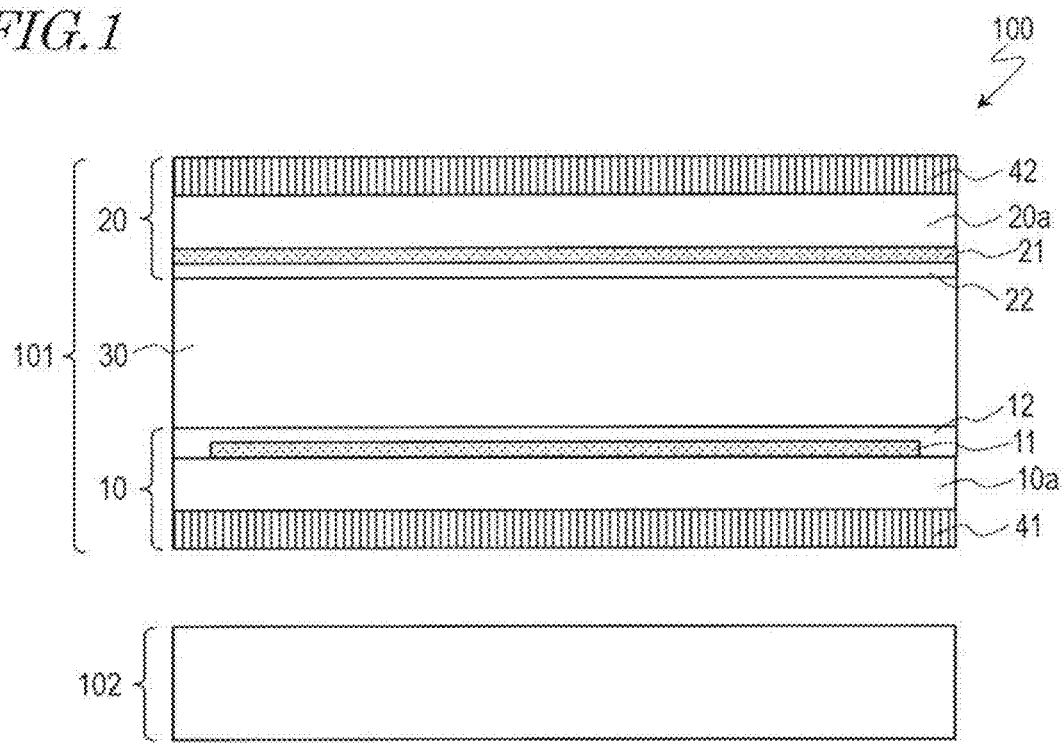
FIG. 1 is a cross-sectional view schematically showing a liquid crystal display apparatus 100 manufactured by a manufacturing method according to an embodiment of the present invention.

Prior to the description of embodiments of the present invention, main terms used herein will be described.

As used herein, the term "vertical alignment type liquid crystal layer" refers to a liquid crystal layer in which liquid crystal molecules are oriented substantially perpendicularly (e.g., at an angle of about 85° or more) to the surface of an alignment film (vertical alignment film). Liquid crystal molecules contained in the vertical alignment type liquid crystal layer have negative dielectric anisotropy. Normally black mode display is carried out by combining the vertical alignment type liquid crystal layer with a pair of polarizing plates that are arranged in crossed Nicols (i.e., the transmission axes of the polarizing plates are substantially orthogonal), facing each other with the liquid crystal layer interposed therebetween.

As used herein, the term "pixel" refers to the smallest unit that represents a particular gray level in display, and in the case of color display, corresponds to a unit that represents the gray level of each of R, G, and B, for example. A combination of an R pixel, a G pixel, and a B pixel forms a color display pixel. As used herein, a region (pixel region) of a liquid crystal display apparatus corresponding to a "pixel" in display is also referred to as a "pixel."

The term "pretilt direction" refers to an alignment direction of liquid crystal molecules defined by an alignment film, which is an azimuth angle direction in a display plane. The angle at which liquid crystal molecules in this case are oriented relative to the surface of the alignment film is referred to as a "pretilt angle." In an embodiment of the present invention, an alignment treatment applied to the alignment film (a treatment for imparting, to the alignment film, the ability to define a predetermined pretilt direction) is performed by a photoalignment treatment. Thus, the alignment film used is a photoalignment film.

By changing the combination of pretilt directions defined by a pair of alignment films (photoalignment films) facing each other with a liquid crystal layer interposed therebetween, a four-domain structure can be formed. When a pixel (pixel region) is divided into four, the pixel has four liquid crystal domains.

Each liquid crystal domain is characterized by a tilt direction (also referred to as a "reference alignment direction") of liquid crystal molecules at or near the center in the layer surface and in the thickness direction of the liquid crystal layer when a voltage is applied to the liquid crystal layer. This tilt direction (reference alignment direction) has a dominant influence on the viewing angle dependency of each domain. Given a vector of a tilted liquid crystal molecule pointing from an end thereof closer to the back substrate toward the farther end (i.e., an end thereof closer to the front substrate) (a vector from the tip toward the head of a pin shown in FIG. 4(c) described below), the tilt direction is the direction of a component in the substrate surface (a projection on the substrate surface) of the vector, which is an azimuth angle direction. The azimuth angle direction is measured with reference to the horizontal direction in the display plane, and counterclockwise rotations represent positive rotations (when the display plane is compared to a clock face, the three o'clock direction is denoted as an azimuth angle of 0°, and counterclockwise rotations represent positive rotations). If the tilt directions of the four liquid crystal domains are set so that the angle between any two of the tilt directions is substantially equal to an integer multiple of 90° (e.g., the 10:30 direction, 7:30 direction, 4:30 direction, and 1:30 direction), the viewing angle characteristics are averaged, and therefore, good display can be obtained. In addition, the four liquid crystal domains preferably have substantially equal areas in the pixel region in terms of uniformity of viewing angle characteristics.

A vertical alignment type liquid crystal layer illustrated in embodiments described below contains liquid crystal molecules having negative dielectric anisotropy (a nematic liquid crystal material having negative dielectric anisotropy). In the vertical alignment type liquid crystal layer, a pretilt direction defined by one of the alignment films is about 90° different from a pretilt direction defined by the other alignment film. An intermediate direction between the two pretilt directions is designated as a tilt direction (reference alignment direction). When a voltage is applied to the liquid crystal layer, liquid crystal molecules near the alignment films take twisted orientations according to the alignment control forces of the alignment films. A chiral dopant may not be added to the liquid crystal layer, or a chiral dopant may be added to the liquid crystal layer if necessary. The VA mode in which twisted orientations of liquid crystal molecules are produced by thus employing a pair of vertical alignment films provided to define orthogonal pretilt directions (alignment treatment directions) is also called a vertical alignment twisted nematic (VATN) mode. In the VATN mode, preferably, the pair of alignment films defines substantially equal pretilt angles.

An alignment treatment to the alignment films is preferably a photoalignment treatment in terms of mass productivity as in an embodiment of the present invention.

The photoalignment treatment can be carried out in a contactless manner, and therefore, unlike a rubbing treatment, there is no static electricity caused by friction, leading to prevention of yield decrease. In addition, by employing a photoalignment film containing a photosensitive group, variations in pretilt angles can be reduced.

[Liquid Crystal Display Device]

Next, a configuration of a liquid crystal display apparatus 100 manufactured by a manufacturing method according to an embodiment of the present invention will be described with reference to FIG. 1. FIG. 1 is a cross-sectional view schematically showing the liquid crystal display apparatus 100, illustrating a region corresponding to a pixel.

As shown in FIG. 1, the liquid crystal display apparatus 100 includes a liquid crystal display panel 101 and a backlight (illumination device) 102. The liquid crystal display panel 101 has an active matrix substrate (first substrate) 10 and a counter substrate (second substrate) 20 that face each other, and a vertical alignment type liquid crystal layer 30 that is provided therebetween. The backlight 102 is provided at the back of the liquid crystal display panel 101 (opposite side from a viewer). The liquid crystal display apparatus 100 also has a plurality of pixels arranged in a matrix including a plurality of rows and a plurality of columns.

The active matrix substrate 10 has a pixel electrode 11 provided for each of the plurality of pixels, and a first photoalignment film 12 provided between the pixel electrodes 11 and the liquid crystal layer 30 (i.e., provided on the frontmost surface closer to the liquid crystal layer 30 of the active matrix substrate 10). The counter substrate 20 has a counter electrode 21 facing the pixel electrodes 11, and a second photoalignment film 22 provided between the counter electrode 21 and the liquid crystal layer 30 (i.e., provided on the frontmost surface closer to the liquid crystal layer 30 of the counter substrate 20). The pixel electrodes 11 and the counter electrode 21 are formed of a transparent conductive material (e.g., ITO). The first photoalignment film 12 and the second photoalignment film 22 each have an alignment control force that causes liquid crystal molecules to be oriented substantially perpendicularly to a surface thereof.

A configuration of each of the active matrix substrate 10 and the counter substrate 20 will now be more specifically described.

The pixel electrodes 11 and the first photoalignment film 12 of the active matrix substrate 10 are provided in this order on the surface closer to the liquid crystal layer 30 of a substrate 10a. In other words, the pixel electrodes 11 and the first photoalignment film 12 are supported by the substrate 10a. The substrate 10a is transparent and has insulating properties. The substrate 10a is, for example, a glass substrate or plastic substrate.

Figure 2:
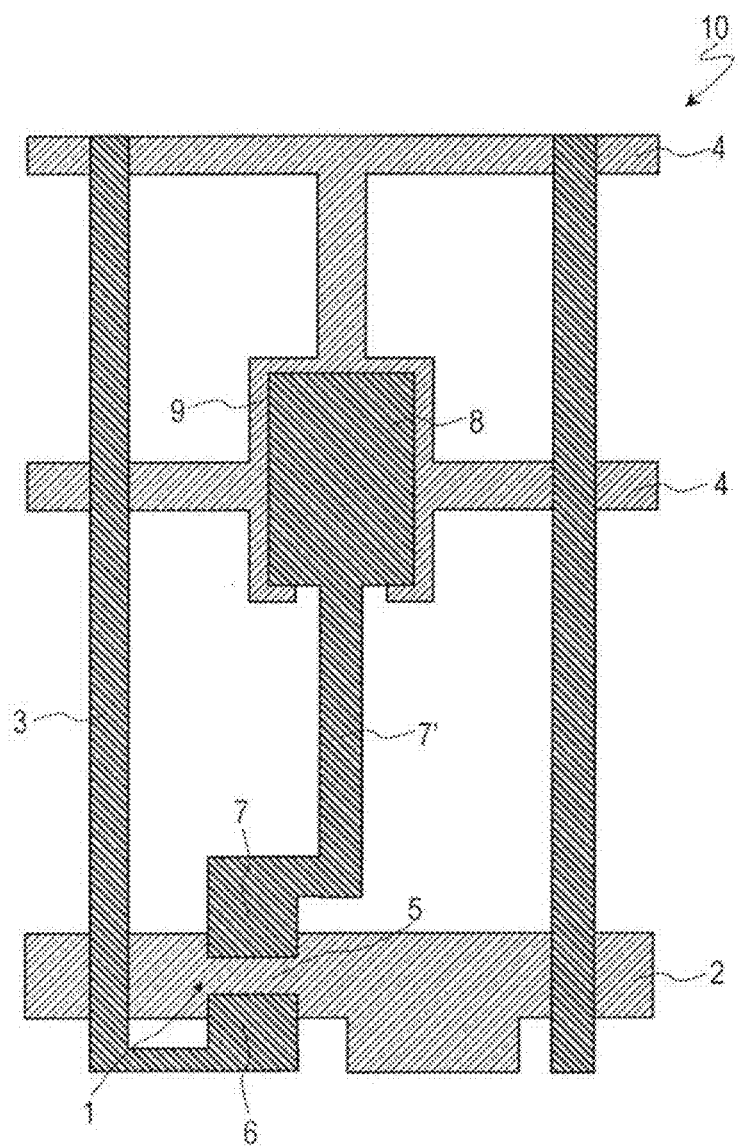
FIG. 2 is a plan view showing an example interconnection structure of an active matrix substrate 10.

The active matrix substrate 10 has, in addition to the pixel electrodes 11 and the first photoalignment film 12 described above, a thin-film transistor (TFT) provided for each pixel, scan lines and signal lines for supplying a scan signal and a display signal to the TFTs, etc. FIG. 2 shows an example interconnection structure of the active matrix substrate 10. FIG. 2 shows an interconnection structure of a region corresponding to a pixel.

As shown in FIG. 2, the active matrix substrate 10 further has a TFT 1, a scan line (gate line) 2 extending in the row direction, a signal line (source line) 3 extending in the column direction, and an auxiliary capacitive line 4 extending in the row direction.

The TFT 1 has a gate electrode 5, a semiconductor layer (not shown), a source electrode 6, and a drain electrode 7. The gate electrode 5 is electrically connected to the gate line 2. In the example of FIG. 2, the gate electrode 5 and the gate line 2 are integrally formed, and a portion (a portion overlapping the semiconductor layer with a gate insulating layer (not shown) interposed therebetween) of the gate line 2 functions as the gate electrode 5. The source electrode 6 is electrically connected to the source line 3. In the example of FIG. 2, the source electrode 6 is a branch portion extending from the source line 3. The drain electrode 7 is electrically connected to the pixel electrode 11. In the example of FIG. 2, a connecting portion 7' is extended from the drain electrode 7. The drain electrode 7 is connected to the auxiliary capacitive electrode 8 by the connecting portion 7'. The auxiliary capacitive electrode 8 is connected to the pixel electrode 11 in a contact hole formed in an interlayer insulating layer (not shown) provided on the auxiliary capacitive electrode 8. Therefore, the drain electrode 7 is electrically connected to the pixel electrode 11 through the auxiliary capacitive electrode 8 and the connecting portion 7'.

The auxiliary capacitive electrode 8 faces an auxiliary capacitive counter electrode 9 with the gate insulating layer interposed therebetween. The auxiliary capacitive counter electrode 9 is electrically coupled to the auxiliary capacitive line 4. In the example of FIG. 2, the auxiliary capacitive counter electrode 9 and the auxiliary capacitive line 4 are integrally formed. More specifically, the auxiliary capacitive line 4 is formed such that a portion thereof is wider than the other portion, and that portion functions as the auxiliary capacitive counter electrode 9. The auxiliary capacitive electrode 8 and the auxiliary capacitive counter electrode 9, and the gate insulating layer located therebetween, together form an auxiliary capacitor.

Note that the interconnection structure of the active matrix substrate 10 is not limited to the example of FIG. 2.

As shown in FIG. 1, the counter electrode 21 and the second photoalignment film 22 of the counter substrate 20 are provided in this order on the surface closer to the liquid crystal layer 30 of a substrate 20a. In other words, the counter electrode 21 and the second photoalignment film 22 are supported by the substrate 20a. The substrate 20a is transparent and has insulating properties. The substrate 20a is, for example, a glass substrate or plastic substrate.

Although not shown, the counter substrate 20 has a color filter layer and a light blocking layer (black matrix) in addition to the counter electrode 21 and the second photoalignment film 22 described above. The color filter layer typically includes a red color filter, a green color filter, and a blue color filter.

The liquid crystal display apparatus 100 further includes a pair of polarizing plates 41 and 42 facing each other with the liquid crystal layer 30 interposed therebetween. The pair of polarizing plates 41 and 42 are arranged so that their transmission axes are substantially orthogonal (i.e., in crossed Nicols).

Next, the alignment division structure of a pixel P of the liquid crystal display apparatus 100 of this embodiment will be described with reference to FIG. 3.

Figure 3:
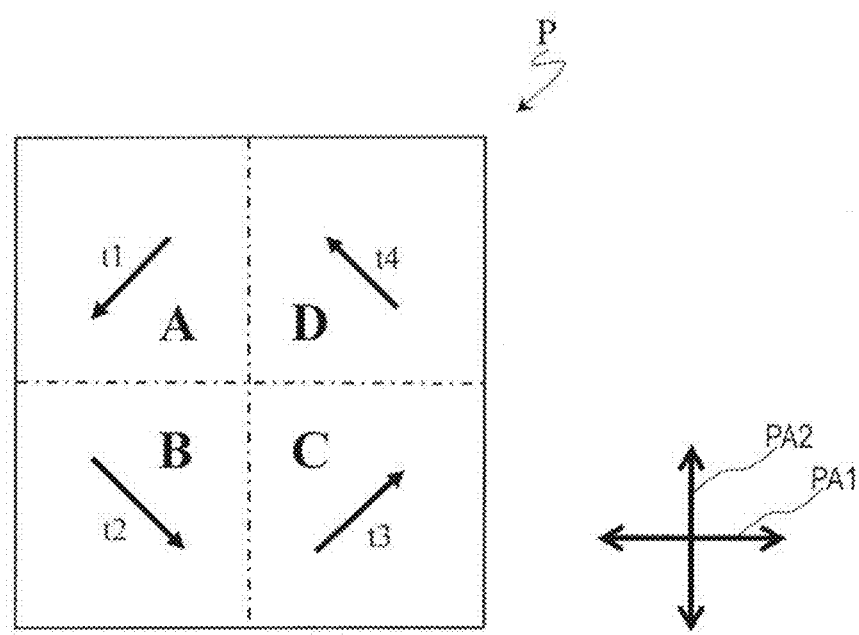
FIG. 3 is a diagram showing an alignment division structure of a pixel P in the liquid crystal display apparatus 100.

As shown in FIG. 3, when a voltage is applied between the pixel electrode 11 and the counter electrode 21, four liquid crystal domains A, B, C, and D are formed in the liquid crystal layer 30 in each pixel P. The four liquid crystal domains A, B, C, and D are arranged in a 2×2 matrix so that each liquid crystal domain is adjacent to the other liquid crystal domains. The four directors (reference alignment directions) t1, t2, t3, and t4 of the liquid crystal domains A, B, C, and D, respectively, have different azimuths.

The directors t1, t2, t3, and t4 are representative alignment directions of liquid crystal molecules contained in the respective liquid crystal domains. In the 4D-RTN mode, the director refers to the tilt direction of liquid crystal molecules that is defined at or near the center in the layer surface and in the thickness direction of the liquid crystal layer (i.e., located at or near the center when the liquid crystal domain is viewed in the direction normal to the display plane and when the liquid crystal domain is viewed in a cross-section taken along the direction normal to the display plane) when a voltage is applied to the liquid crystal layer. Each liquid crystal domain is characterized by the azimuth of the director (the above tilt direction). The director azimuth has a dominant influence on the viewing angle dependency of each domain. The directors (reference alignment directions) t1, t2, t3, and t4 are each defined by the first photoalignment film 12 and the second photoalignment film 22.

Assuming that the azimuth angle of the horizontal direction (3 o'clock direction) of the display plane is 0°, the azimuth of the director t1 of the liquid crystal domain A is an about 225° direction, the azimuth of the director t2 of the liquid crystal domain B is an about 315° direction, the azimuth of the director t3 of the liquid crystal domain C is an about 45° direction, and the azimuth of the director t4 of the liquid crystal domain D is an about 135° direction. In other words, the difference between any two of the azimuths of the four directors of the liquid crystal domains A, B, C, and D is substantially equal to an integer multiple of 90°. In addition, the liquid crystal domains A, B, C, and D are arranged so that the azimuths of the directors of adjacent liquid crystal domains are about 90° different from each other.

One of the transmission axes (polarization axes) PA1 and PA2 of the pair of polarizing plates 41 and 42 is parallel to the horizontal direction of the display plane, and the other is parallel to the vertical direction of the display plane. Therefore, the angles between the transmission axes (polarization axes) PA1 and PA2 of the polarizing plates 41 and 42 and the azimuths of the directors t1, t2, t3, and t4 of the liquid crystal domains A, B, C, and D are about 45°.

Although FIG. 3 shows an example in which the four liquid crystal domains A, B, C, and D have equal areas in the pixel P, the areas of the four liquid crystal domains A, B, C, and D may not be equal to each other. Note that the differences in area between the four liquid crystal domains A, B, C, and D are preferably reduced to the extent possible in terms of uniformity of viewing angle characteristics. In the example of FIG. 3, the example four-domain structure is most preferable (i.e., ideal) in terms of viewing angle characteristics.

Next, an alignment division method for obtaining the alignment division structure of the pixel P will be described with reference to FIGS. 4(a), 4(b), and 4(c). FIG. 4(a) shows pretilt directions PD1 and PD2 that are defined by the first photoalignment film 12 provided on the active matrix substrate 10. FIG. 4(b) shows pretilt directions PD3 and PD4 that are defined by the second photoalignment film 22 provided on the counter substrate 20. FIG. 4(c) shows tilt directions (directors) that are defined when a voltage is applied to the liquid crystal layer 30 after the active matrix substrate 10 and the counter substrate 20 are attached together. Note that FIGS. 4(a), 4(b), and 4(c) show the active matrix substrate 10, the counter substrate 20, and the liquid crystal layer 30 as viewed from a viewer. Therefore, in FIG. 4(a), the alignment film is located closer to the viewer of the drawing sheet than is the substrate, and in FIG. 4(b), the alignment film is located deeper from the viewer of the drawing sheet than is the substrate. The pretilt directions and the tilt directions are represented by schematic pins. The head (end portion having a larger area) of a pin represents a front end portion (closer to the viewer) of a liquid crystal molecule, and the tip (end portion having a smaller area) of a pin represents an end portion closer to a back end portion of a liquid crystal molecule.

As shown in FIG. 4(a), the first photoalignment film 12 has, in each pixel P, a first alignment region 12a that defines the first pretilt direction PD1, and a second alignment region 12b that defines the second pretilt direction PD2 antiparallel to the first pretilt direction PD1. Specifically, the region corresponding to a pixel P of the first photoalignment film 12 is vertically divided into two regions (left and right regions). These regions (first and second alignment regions) 12a and 12b are subjected to a photoalignment treatment so as to be able to define the antiparallel pretilt directions (first and second pretilt directions) PD1 and PD2. Here, the photoalignment treatment is carried out by oblique irradiation with ultraviolet light (e.g., linear polarized ultraviolet light) in directions indicated by arrows.

As shown in FIG. 4(b), the second photoalignment film 22 has, in each pixel P, a third alignment region 22a that defines the third pretilt direction PD3 substantially orthogonal to the first pretilt direction PD1 and the second pretilt direction PD2, and a fourth alignment region 22b that defines the fourth pretilt direction PD4 antiparallel to the third pretilt direction PD3. Specifically, the region corresponding to a pixel P of the second photoalignment film 22 is horizontally divided into two regions (upper and lower regions). These regions (third and fourth alignment regions) 22a and 22b are subjected to a photoalignment treatment so as to be able to define the antiparallel pretilt directions (third and fourth pretilt directions) PD3 and PD4. Here, the photoalignment treatment is carried out by oblique irradiation with ultraviolet light (e.g., linear polarized ultraviolet light) in directions indicated by arrows.

By attaching together the active matrix substrate and the counter substrate 20 subjected to the photoalignment treatment of FIGS. 4(a) and 4(b), an alignment division (multi-domain) pixel P can be formed as shown in FIG. 4(c). In each of the liquid crystal domains A-D, a pretilt direction defined by the first photoalignment film 12 on the active matrix substrate 10 is about 90° different from a pretilt direction defined by the second photoalignment film 22 on the counter substrate 20. As can be seen from FIG. 4(c), tilt directions (reference alignment directions) that are an intermediate direction between the two pretilt directions are defined.

In addition, a boundary between the first pretilt region 12a and the second pretilt region 12b, and a boundary between the third pretilt region 22a and the fourth pretilt region 22b, are boundaries (domain boundaries) BD1 and BD2 between adjacent ones of the four liquid crystal domains A, B, C, and D. Here, one (hereinafter referred to as a "first domain boundary") BD1 of the boundaries BD1 and BD2 extends in parallel to the column direction. The first domain boundary BD1 is a boundary between the first alignment region 12a and the second alignment region 12b. In other words, the first alignment region 12a and the second alignment region 12b are adjacent to each other with the first domain boundary BD1 interposed therebetween. Here, the other (hereinafter referred to as a "second domain boundary") BD2 of the boundaries BD1 and BD2 extends in parallel to the row direction. The second domain boundary BD2 is a boundary between the third alignment region 22a and the fourth alignment region 22b. In other words, the third alignment region 22a and the fourth alignment region 22b are adjacent to each other with the second domain boundary BD2 interposed therebetween. The liquid crystal domains A and D are adjacent to each other with the first domain boundary BD1 interposed therebetween. Likewise, the liquid crystal domains B and C are adjacent to each other with the first domain boundary BD1 interposed therebetween. In addition, the liquid crystal domains A and B are adjacent to each other with the second domain boundary BD2 interposed therebetween. Likewise, the liquid crystal domains C and D are adjacent to each other with the second domain boundary BD2 interposed therebetween.

Note that in the alignment division structure illustrated herein, as shown in FIG. 4(c), dark lines DL occur in the pixel P. The dark lines DL include portions DLa located at the boundaries between adjacent liquid crystal domains, and portions DLb located at or near edges of the pixel electrode 11. The reason why such dark lines DL occur is disclosed in Patent Document No. 1.

[Exposure Device]

A configuration of an exposure device for use in a manufacturing method according to an embodiment of the present invention will be described.

Figure 5:
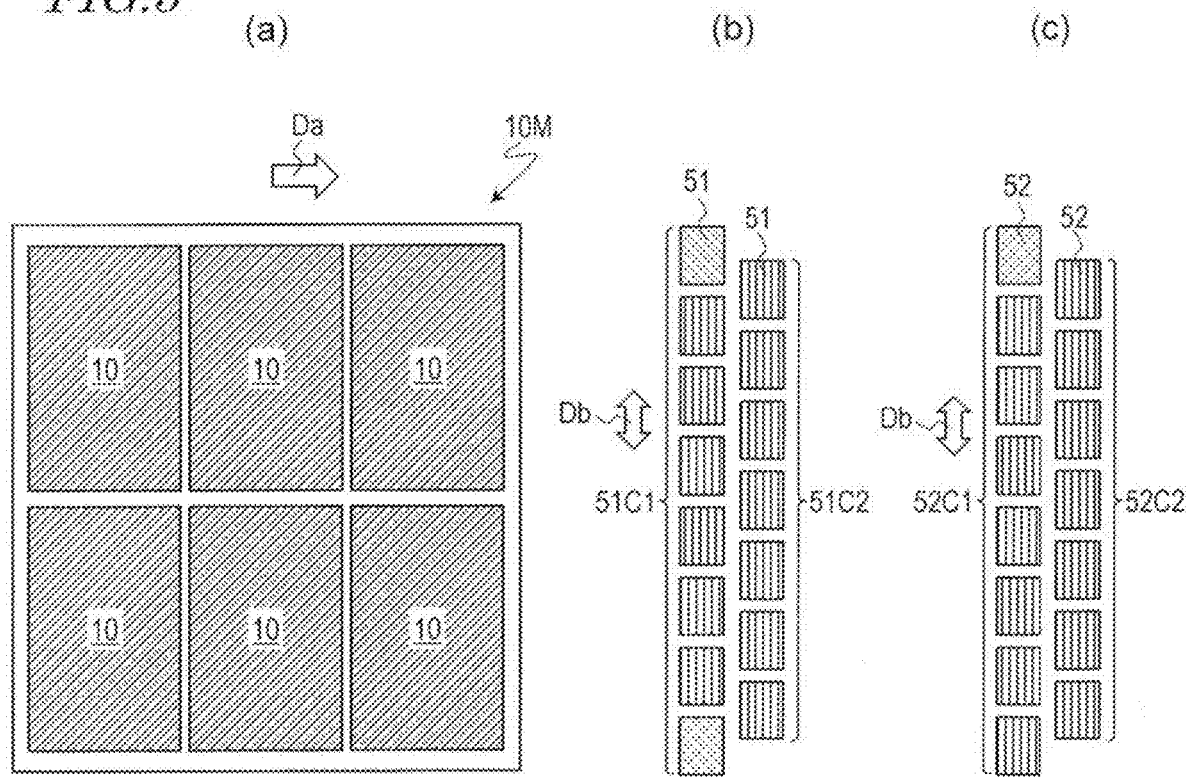
FIG. 5(a) is a plan view showing an example mother substrate 10M.
FIGS. 5(b) and 5(c) are plan views showing arrays of photomasks 51 and 52 for exposing the mother substrate 10M of FIG. 5(a) to light.

FIG. 5(a) shows an example mother substrate which is exposed to light using an exposure device. In the example shown in FIG. 5(a), a mother substrate 10M includes six active matrix substrates 10. For example, the mother substrate 10M has the 10th-generation size, and each active matrix substrate 10 is for a 69.5-inch liquid crystal display apparatus.

FIGS. 5(b) and 5(c) are diagrams showing arrays of photomasks 51 and 52 for exposing the mother substrate 10M of FIG. 5(a). FIG. 5(b) is a diagram showing an array of first photomasks 51 for use in a step of exposing the first alignment region 12a of the first photoalignment film 12. FIG. 5(c) is a diagram showing an array of second photomasks 52 for use in a step of exposing the second alignment region 12b of the first photoalignment film 12. Here, a transport direction Da of the mother substrate 10M is a direction from left to right in the figure (see FIG. 5(a)).

In the example shown in FIG. 5(b), the plurality of first photomasks 51 are arranged to form a first mask column 51C1 and a second mask column 51C2 that are adjacent to each other in the transport direction Da. The first mask column 51C1 and the second mask column 51C2 each include two or more first photomasks 51 arranged in a direction (also hereinafter referred to as an "array direction") Db intersecting (e.g., substantially orthogonally intersecting) the transport direction Da. Here, the first mask column 51C1 and the second mask column 51C2 include eight and seven first photomasks 51, respectively.

In the example shown in FIG. 5(c), the plurality of second photomasks 52 are arranged to form a first mask column 52C1 and a second mask column 52C2 that are adjacent to each other in the transport direction Da. The first mask column 52C1 and the second mask column 52C2 each include two or more second photomasks 52 arranged in the array direction Db intersecting the transport direction Da. Here, the first mask column 52C1 and the second mask column 52C2 include eight and seven second photomasks 52, respectively.

Figure 6:
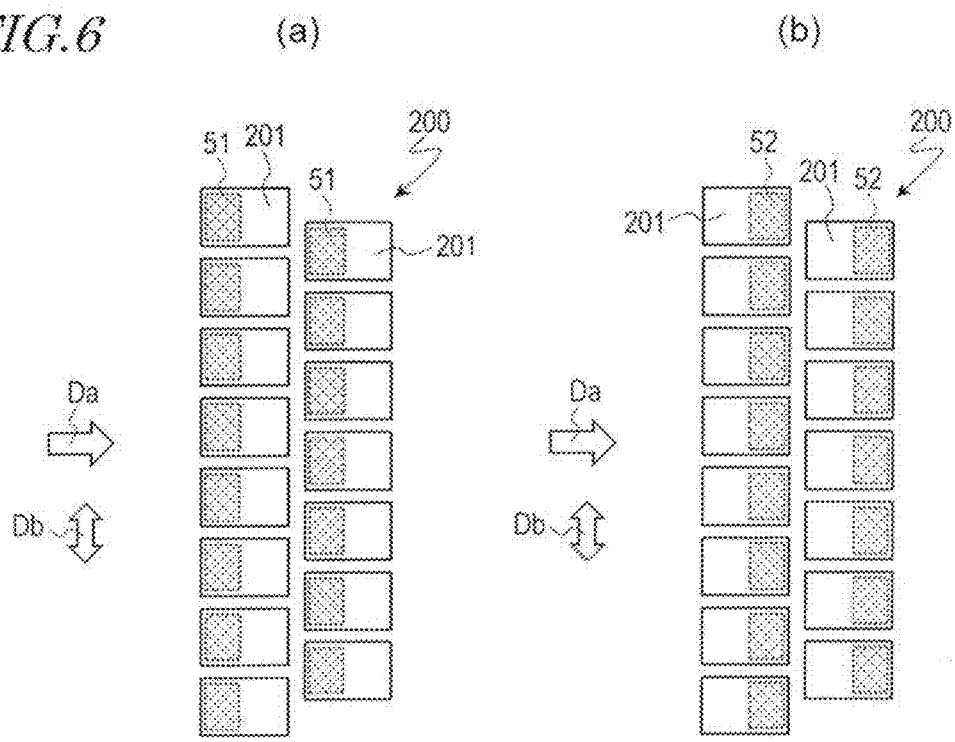
FIGS. 6(a) and 6(b) are plan views schematically showing an exposure device 200 for performing scanning exposure using the arrays of photomasks 51 and 52 of FIGS. 5(b) and 5(c).
Figure 7:
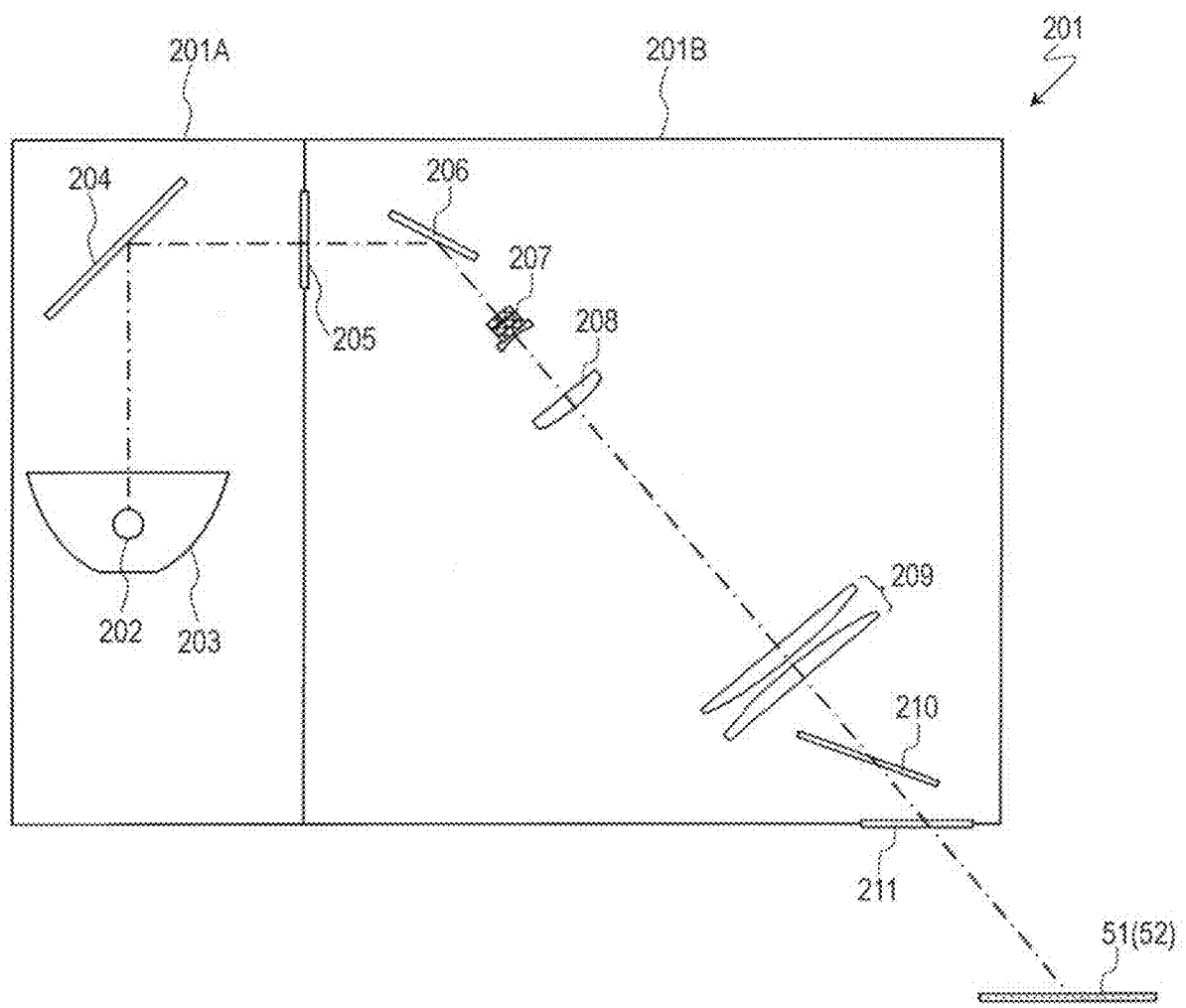
FIG. 7 is a diagram showing a configuration of an exposure unit 201 included in the exposure device 200.

An example exposure device for performing scanning exposure using the arrayed photomasks 51 and 52 shown in FIGS. 5(b) and 5(c) is shown in FIGS. 6(a), 6(b), and 7. FIGS. 6(a) and 6(b) are plan views schematically showing an exposure device 200, and FIG. 7 is a diagram showing a configuration of an exposure unit 201 included in the exposure device 200.

As shown in FIGS. 6(a) and 6(b), the exposure device 200 has a plurality of exposure units 201. FIG. 6(a) shows a positional relationship between the exposure units 201 and the first photomasks 51, and FIG. 6(b) shows a positional relationship between the exposure units 201 and the second photomasks 52. As shown in FIG. 6(a), the plurality of exposure units 201 are each provided for a corresponding one of the plurality of first photomasks 51. As shown in FIG. 6(b), the plurality of exposure units 201 are each provided for a corresponding one of the plurality of second photomasks 52.

As shown in FIG. 7, the exposure unit 201 includes a light source housing 201A and an optical system housing 201B.

The light source housing 201A houses a light source 202 that emits light (ultraviolet light), an elliptical mirror 203 that reflects and focuses light emitted from the light source 202, and a mirror 204 that reflects light reflected by the elliptical mirror 203 to change the direction in which the light travels. The light source 202 is, for example, a mercury-vapor lamp. The light source housing 201A is also provided with a window member 205 that transmits light reflected by the mirror 204.

The optical system housing 201B houses a mirror 206 that reflects light transmitted through the window member 205 to change the direction in which the light travels, a fly's eye lens 207 that causes the light reflected by the mirror 206 to have a uniform light intensity distribution, a cylindrical lens 208 that focuses the light from the fly's eye lens 207, a condenser lens 209 that causes the light from the cylindrical lens 208 to be parallel light, and a polarizing plate 210 that reflects s-polarized light of the light from the condenser lens 209 and transmits p-polarized light of the light from the condenser lens 209. The optical system housing 201B is also provided with a window member 211 that transmits the light transmitted through the polarizing plate 210 to the outside. The light transmitted through the window member 211 illuminates the first photomask 51 (or the second photomask 52).

Note that the configurations of the exposure device 200 and the exposure unit 201 are not limited to those illustrated herein. For example, the optical system of the exposure unit 201 is not limited to that illustrated in FIG. 7.

[Cause of Streak Irregularity]

As described above, in the exposure device 200, the exposure units 201 are provided for the respective first photomasks 51 (or the respective second photomasks 52). Therefore, light for exposure (exposure light) is guided to each first photomask 51 (or each second photomask 52) by an optical system (including the fly's eye lens 207, the cylindrical lens 208, and the condenser lens 209 in the example illustrated) provided for that first photomask 51 (or that second photomask 52) (i.e., the first photomasks 51 (or the second photomasks 52) and the optical systems are in one-to-one correspondence).

Figure 8:
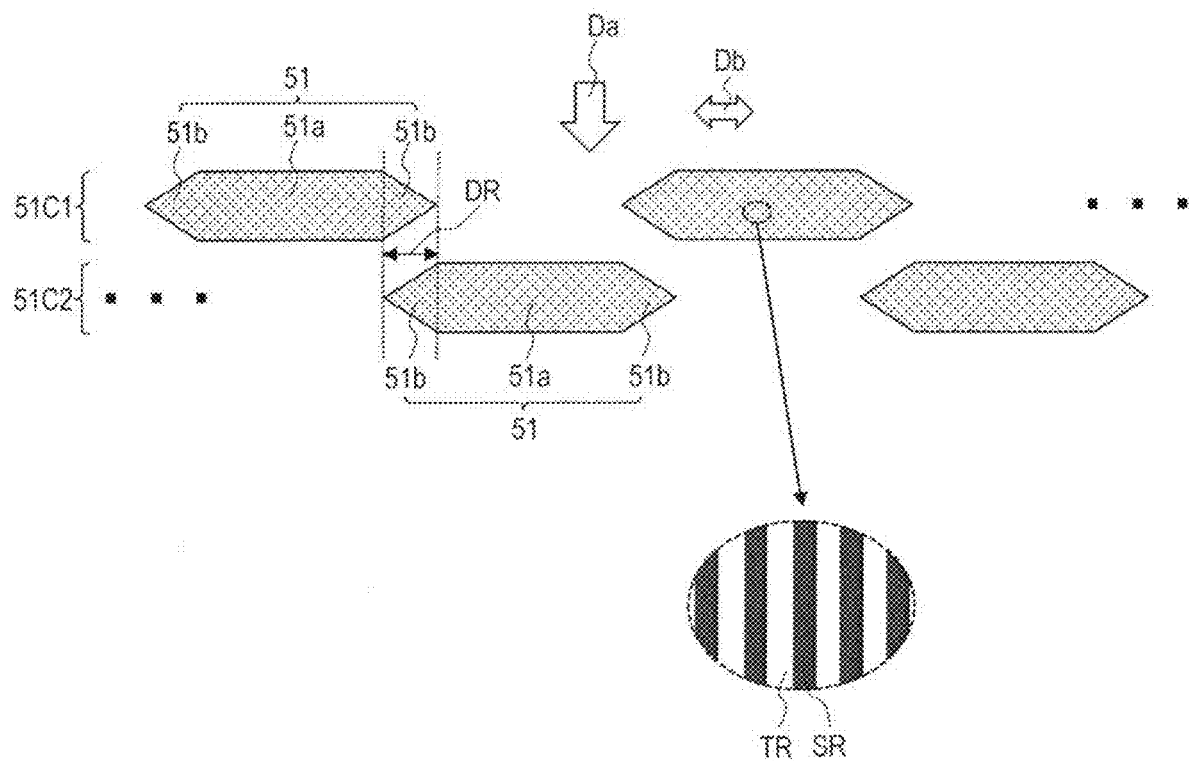
FIG. 8(a) is a diagram showing an array of first photomasks 51.
FIG. 8(b) is a diagram showing an array of second photomasks 52.
Figure 8:
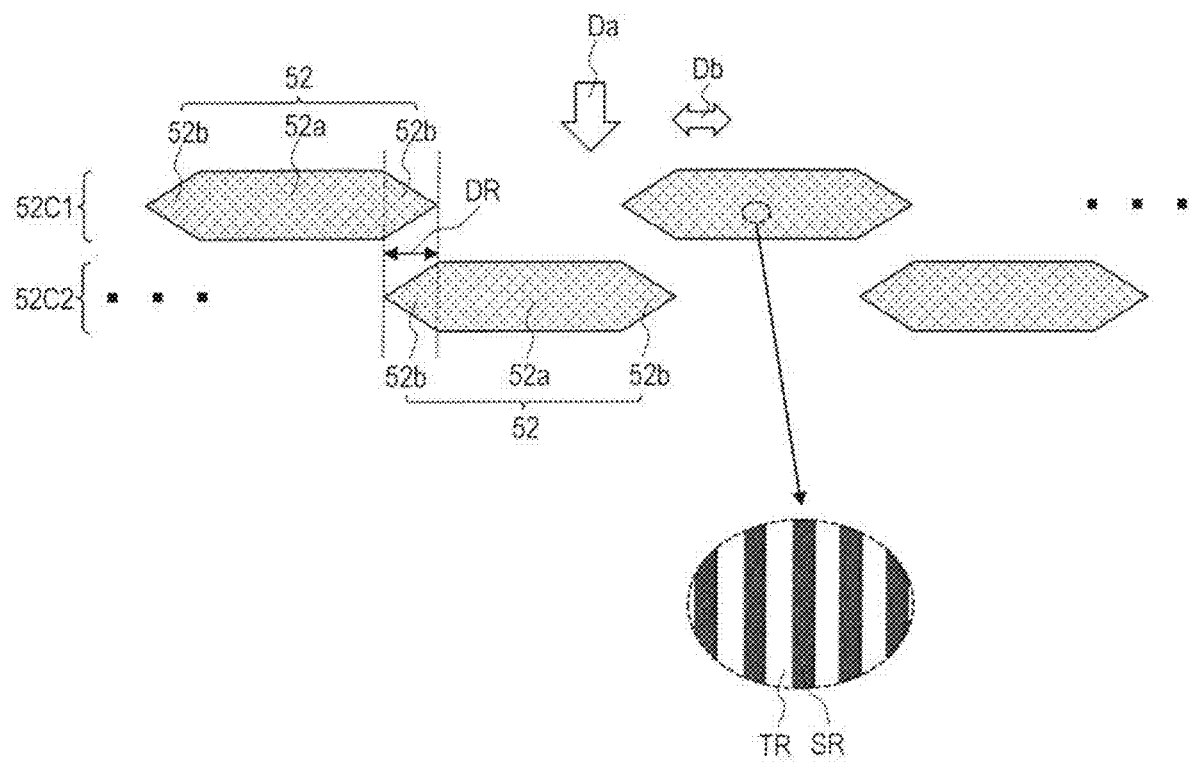

FIGS. 8(a) and 8(b) show arrays of the first photomasks 51 and the second photomasks 52. In FIGS. 8(a) and 8(b), for the first photomask 51 and the second photomask 52, an outer shape of a portion in which a mask pattern is formed (mask pattern formation portion) is shown as an outer shape of the mask.

In the example shown in FIG. 8(a), the first photomask 51 (the mask pattern formation portion of the first photomask 51) is generally hexagonal, including a rectangular main portion 51a, and a triangular end portion 51b located at either end of the main portion 51a.

As shown in FIG. 8(a), the first photomasks 51 in the first mask column 51C1, and the first photomasks 51 in the second mask column 51C2, are arranged so that the first photoalignment film 12 has regions to be doubly exposed. Specifically, the first photomasks 51 in the first mask column 51C1, and the first photomasks 51 in the second mask column 51C2, are arranged so that the first photoalignment film 12 has a mask joint portion (a region overlaying a region DR in FIG. 8(a)) to be exposed to light transmitted through both of an end portion 51b of the first photomask 51 in the first mask column 51C1 and an end portion 51b of the first photomask 51 in the second mask column 51C2. In the case where a plurality of first photomasks 51 are used for exposure, the first photomasks 51 may vary in quality, but the presence of such a mask joint portion allows a gradual change in quality between the first photomasks 51. As shown in a lower portion of FIG. 8(a), each first photomask 51 has stripe-shaped light-blocking portions SR and light-transmitting portions (slits) TR.

In the example shown in FIG. 8(b), the second photomask 52 (a mask pattern formation portion of the second photomask 52) is generally hexagonal, including a rectangular main portion 52a, and a triangular end portion (an end portion in a direction intersecting the transport direction D) 52b located on either end of the rectangular main portion 52a.

As shown in FIG. 8(b), the second photomasks 52 in the first mask column 52C1, and the second photomasks 52 in the second mask column 52C2, are arranged so that the first photoalignment film 12 has regions to be doubly exposed. Specifically, the second photomasks 52 in the first mask column 52C1, and the second photomasks 52 in the second mask column 52C2, are arranged so that the first photoalignment film 12 has a mask joint portion (a region overlaying a region DR in FIG. 8(b)) to be exposed to light transmitted through both of an end portion 52b of the second photomask 52 in the first mask column 52C1 and an end portion 52b of the second photomask 52 in the second mask column 52C2. In the case where a plurality of second photomasks 52 are used for exposure, the second photomasks 52 may vary in quality, but the presence of such a mask joint portion allows a gradual change in quality between the second photomasks 52. As shown in a lower portion of FIG. 8(b), each second photomask 52 has stripe-shaped light-blocking portions SR and light-transmitting portions (slits) TR.

Streak irregularity occurs when a position (exposed position) of a region exposed to light through the light-transmitting portion TR is offset from its normal position. This will be more specifically described with reference to FIG. 9.

FIG. 9(a) shows five regions R1, R2, R3, R4, and R5 in a first photomask 51. The five regions R1, R2, R3, R4, and R5 are aligned in the array direction Db.

FIG. 9(b) shows offsets of exposed positions in the regions R1, R2, R3, R4, and R5. In FIG. 9(b), normal exposed positions are represented by a dotted line, and actual exposed positions are represented by a solid line. As shown in FIG. 9(b), in the region R3 located at the center of the first photomask 51, the exposed position is not offset. In contrast to this, in the region R2 located on the left side of the region R3, the exposed position is relatively slightly offset to the right, and in the region R1 located on the left side of the region R2, the exposed position is relatively largely offset to the right. In the region R4 located on the right side of the region R3, the exposed position is relatively slightly offset to the left, and in the region R5 located on the right side of the region R4, the exposed position is relatively largely offset to the left.

FIG. 9(c) shows microscopic images of pixels corresponding to the regions R1, R2, R3, R4, and R5. As can be seen from FIG. 9(c), in a pixel corresponding to a region (the regions R1 and R5) having a large exposed position offset, the position where a dark line occurs is offset due to the offset of the exposed position, so that a dark line which should normally be blocked is visible. Such a positional offset of a dark line causes a deviation (variation) in transmittance (luminance).

Figure 9:
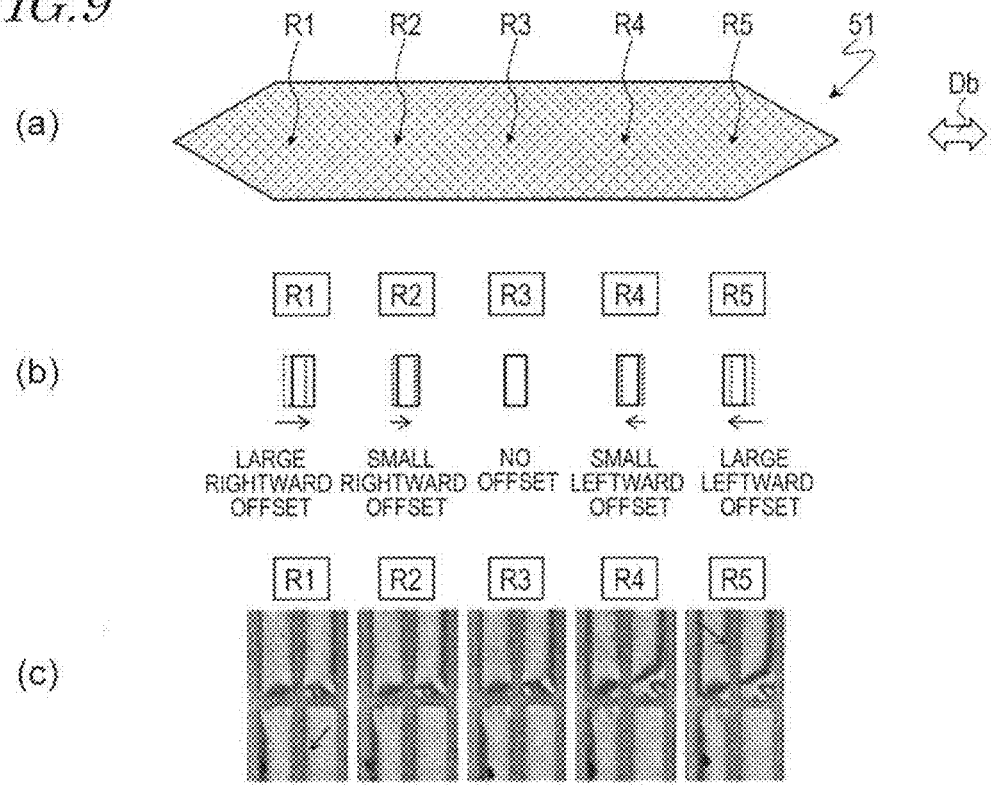
FIGS. 9(a), 9(b), and 9(c) are diagrams for describing a reason why an offset of an exposed position occurs.

Although FIG. 9 illustrates the first photomask 51, a similar problem arises in an exposure step employing the second photomask 52.

A reason why the exposed position offset occurs will be described with reference to FIGS. 10(a) and 10(b).

Figure 10:
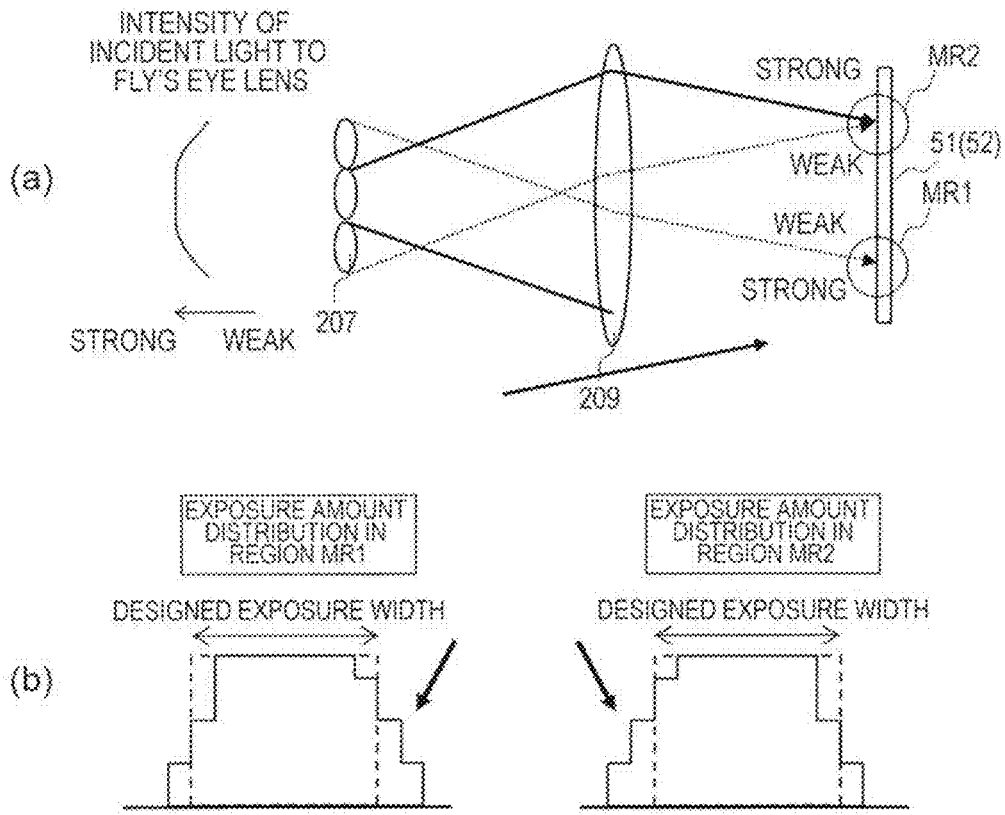
FIGS. 10(a) and 10(b) are diagrams for describing a reason why an offset of an exposed position occurs.

As shown in FIG. 10(a), incident light to the fly's eye lens 207 has an intensity distribution in which the incident light has a relatively high intensity at a center, and a relatively low intensity on an outer side. Therefore, on the light-illuminated surface of the first photomask 51 (or the second photomask 52), inward light has a relatively high intensity, and outward light has a relatively low intensity. FIG. 10(b) shows exposure amount distributions of regions MR1 and MR2 of FIG. 10(a). Because of the high intensity of inward light, the exposure amount distribution differs from its normal distribution (represented by a dotted line in FIG. 10(b)), and the exposed position is offset inward, as shown in FIG. 10(b).

Thus, an offset of the exposed position causes streak irregularity. At the mask joint portion, offsets in opposite directions of the exposed position occur together, likely leading to the occurrence of streak irregularity.

[Manufacturing Method for Liquid Crystal Display Device]

A manufacturing method for a liquid crystal display apparatus according to an embodiment of the present invention will be described.

Initially, a mother substrate (hereinafter referred to as a "first mother substrate") is prepared which includes a plurality of active matrix substrates 10 having pixel electrodes 11 and a first photoalignment film 12 that has not been subjected to an alignment treatment. This step can be performed using known techniques.

Next, while the active matrix substrates 10 (first mother substrate) thus prepared are being transported in a predetermined transport direction Da, regions of the first photoalignment film 12 that are to serve as first alignment regions 12a are exposed through a plurality of first photomasks 51. The first photomask 51 used in this step (first exposure step) includes a plurality of pairs of a light-transmitting portion TR that transmits exposure light for exposing a region of the first photoalignment film 12 which is to serve as a first alignment region 12a, and a light-blocking portion SR that blocks light toward a region of the first photoalignment film 12 which is to serve as a second alignment region 12b (see FIG. 8(a)). These pairs are aligned in the array direction Db. A boundary (also hereinafter referred to as a "light-transmitting portion-light-blocking portion boundary") between the light-transmitting portion TR and the light-blocking portion SR included in each pair (i.e., for forming the first alignment region 12a and the second alignment region 12b in the same pixel) extends generally in parallel to the transport direction Da. The plurality of light-transmitting portion-light-blocking portion boundaries are aligned in the array direction Db.

This step (first exposure step) will be more specifically described with reference to FIG. 11.

Figure 11:
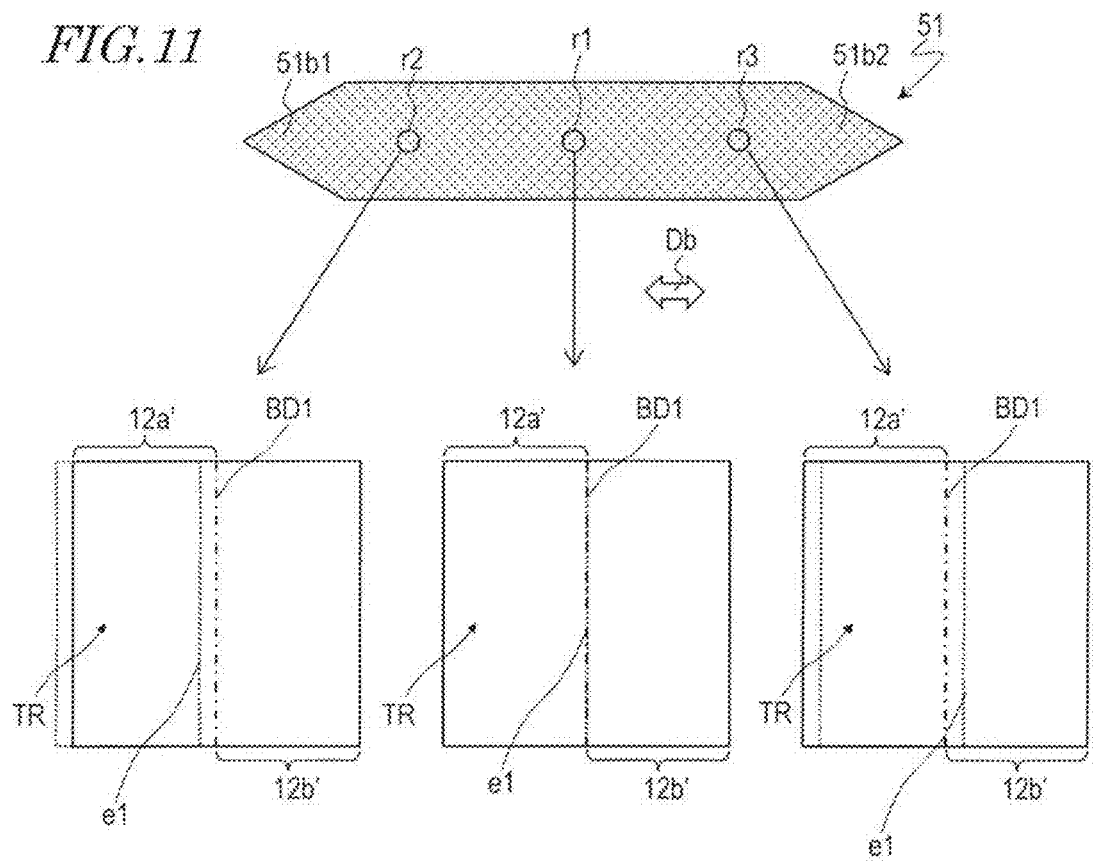

An upper portion of FIG. 11 shows a first photomask 51, and a lower portion of FIG. 11 shows the position of a light-transmitting portion TR in a region corresponding to a pixel in each of three regions r1, r2, and r3 of the first photomask 51. In the lower portion of FIG. 11, the light-transmitting portion TR is represented by a dotted line, and a boundary (i.e., a first domain boundary) BD1 between a region 12a' which is to serve as a first alignment region 12a and a region 12b' which is to serve as a second alignment region 12b is represented by a dot-dash line.

In the region r1 located at a center in the array direction Db of the first photomask 51, an inner edge e1 of the light-transmitting portion TR (corresponding to a boundary between the light-transmitting portion TR and the light-blocking portion SR) substantially coincides with the first domain boundary BD1. In other words, the inner edge e1 of the light-transmitting portion TR is not offset from the first domain boundary BD1.

In the region r2 located closer to an end (here, the left end) 51b1 in the array direction Db of the first photomask 51, the inner edge e1 of the light-transmitting portion TR is offset from the first domain boundary BD1 toward the end 51b1 (i.e., outward).

In the region r3 located closer to the other end (here, the right end) 51b2 in the array direction Db of the first photomask 51, the inner edge e1 of the light-transmitting portion TR is offset from the first domain boundary BD1 toward the other end 51b2 (i.e., outward).

Next, while the active matrix substrates 10 (first mother substrate) are being transported in the transport direction Da, regions 12b' of the first photoalignment film that are to serve as second alignment regions 12b are exposed through a plurality of second photomasks 52. The second photomask 52 used in this step (second exposure step) includes a plurality of pairs of a light-transmitting portion TR that transmits exposure light for exposing a region 12b' of the first photoalignment film 12 which is to serve as a second alignment region 12b, and a light-blocking portion SR that blocks light toward a region 12a of the first photoalignment film 12 which is to serve as a first alignment region 12a (see FIG. 8(b)). These pairs are aligned in the array direction Db. A boundary (also hereinafter referred to as a "light-transmitting portion-light-blocking portion boundary") between the light-transmitting portions TR and the light-blocking portions SR included in each pair extends generally in parallel to the transport direction Da. The plurality of light-transmitting portion-light-blocking portion boundaries are aligned in the array direction Db.

This step (second exposure step) will be more specifically described with reference to FIG. 12.

Figure 12:
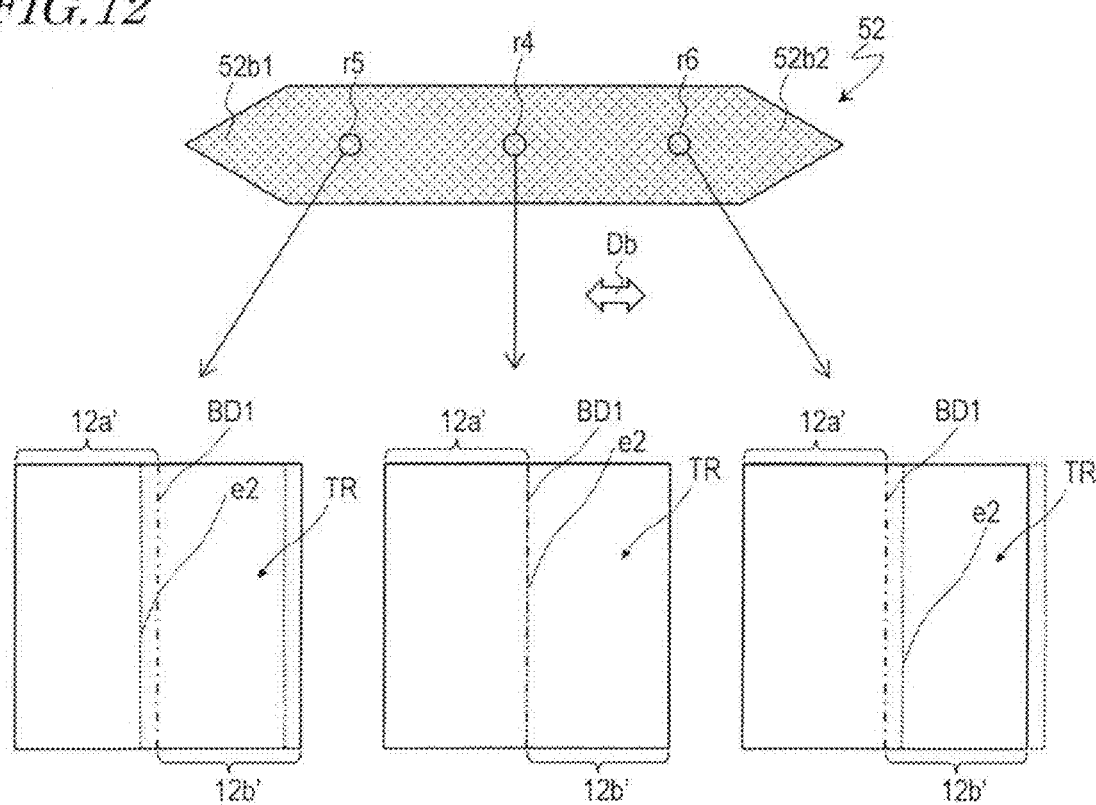
FIG. 12 is a diagram showing a position of a light-transmitting portion TR of a second photomask 52 in a step (second exposure step) of exposing a region of the first photoalignment film 12 that is to serve as a second alignment region 12b.

An upper portion of FIG. 12 shows a second photomask 52, and a lower portion of FIG. 12 shows the position of a light-transmitting portions TR in a region corresponding to a pixel in each of three regions r4, r5, and r6 of the second photomask 52.

In the region r4 located at a center in the array direction Db of the second photomask 52, an inner edge e2 of the light-transmitting portion TR substantially coincides with the first domain boundary BD1. In other words, the inner edge e2 of the light-transmitting portion TR is not offset from the first domain boundary BD1.

In the region r5 located closer to an end (here, the left end) 52b1 in the array direction Db of the second photomask 52, the inner edge e2 of the light-transmitting portion TR is offset from the first domain boundary BD1 toward the end 52b1 (i.e., outward).

In the region r6 located closer to the other end (here, the right end) 52b2 in the array direction Db of the second photomask 52, the inner edge e2 of the light-transmitting portion TR is offset from the first domain boundary BD1 toward the other end 52b2 (i.e., outward).

Thus, the active matrix substrates 10 (first mother substrate) in which the first photoalignment film 12 has been subjected to the photoalignment treatment can be obtained.

Apart from the step of obtaining the active matrix substrates 10, a mother substrate (hereinafter referred to as a "second mother substrate") including a plurality of counter substrates 20 including a counter electrode 21 and a second photoalignment film 22 is prepared. This step can be performed using known techniques.

Next, the first and second mother substrates are attached together to form a mother panel including a plurality of liquid crystal display panels. The first and second mother substrates are bonded and fixed together by a sealing member formed surrounding the display region of each liquid crystal display panel.

Thereafter, the mother panel can be divided to obtain the liquid crystal display panels. The liquid crystal layer 30 between the active matrix substrate 10 and the counter substrate 20 can be formed by a dropping or vacuum injection technique.

As described above, in the manufacturing method of this embodiment, the first photomask 51 is designed so that in the first exposure step, the inner edge e1 of the light-transmitting portion TR is offset from the first domain boundary BD1 toward the end 51b1 (outward) on the side closer to the end 51b1 of the first photomask 51, and is offset from the first domain boundary BD1 toward the end 51b2 (outward) on the side closer to the end 51b2 of the first photomask 51. The second photomask 52 is designed so that in the second exposure step, the inner edge e2 of the light-transmitting portion TR is offset from the first domain boundary BD1 toward the end 52b1 (outward) on the side closer to the end 52b1 of the second photomask 52, and is offset from the first domain boundary BD1 toward the end 52b2 (outward) on the side closer to the end 52b2 of the second photomask 52. Therefore, the occurrence of an offset (inward offset) of an exposed position as described with reference to FIG. 9 can be prevented or reduced.

Thus, in the manufacturing method of this embodiment, the inward offset of an exposed position can be prevented or reduced by offsetting the inner edges e1 and e2 of the light-transmitting portions TR outward from their normal positions. The amount of an offset of the inner edge e1, e2 of the light-transmitting portion TR from the first domain boundary BD1 is also referred to as a "mask correction amount." The mask correction amount may be set, as appropriate, depending on an offset of an exposed position obtained from a liquid crystal display apparatus manufactured using a conventionally designed photomask (i.e., the mask correction amount is zero over the entire mask).

Note that as described above with reference to FIG. 9, the offset of an exposed position increases as one moves outward from the center of the first photomask 51. Therefore, in order to prevent or reduce the offset of an exposed position to a desirable extent, the first photomask 51 is preferably designed so that the mask correction amount increases as one moves from the center toward the end 51b1 of the first photomask 51, and the mask correction amount increases as one moves from the center toward the end 51b2 of the first photomask 51. Likewise, in order to prevent or reduce the offset of an exposed position to a desirable extent, the second photomask 52 is preferably designed so that the mask correction amount increases as one moves from the center toward the end 52b1 of the second photomask 52, and the mask correction amount increases as one moves from the center toward the end 52b2 of the second photomask 52.

Figure 13:
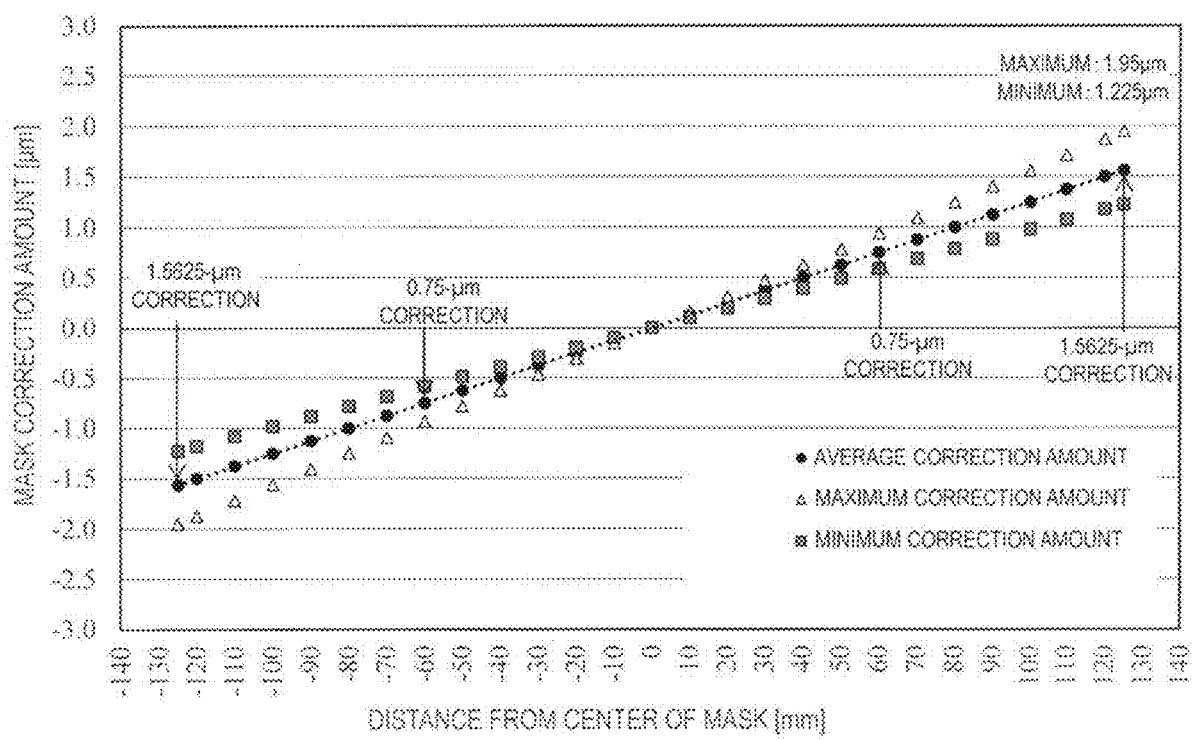
FIG. 13 is a graph showing example settings of a mask correction amount.

FIG. 13 shows example settings of the mask correction amount. FIG. 13 is a graph showing a relationship between the distance [mm] from the center of a photomask (the first photomask 51 or the second photomask 52) and the mask correction amount [μm]. FIG. 13 shows the mask correction amounts of a photomask having the minimum correction amount and a photomask having the maximum correction amount of the plurality of photomasks, and the average mask correction amount of the plurality of photomasks. The distance from the center of a photomask is positive on the right side of the center and is negative on the left side of the center, and the mask correction amount is positive for rightward offsets and is negative for leftward offsets.

In the example shown in FIG. 13, the length of a photomask in the array direction Db is 250 mm. The width of a pixel in the array direction Db is 66.8 µm. As shown in FIG. 13, the mask correction amount increases as one moves outward from the center of a photomask. The mask correction amount at an outermost end of a photomask is ±1.225 µm for a photomask having the minimum correction amount, and ±1.95 µm for a photomask having the maximum correction amount, and the average is ±1.5625 µm. The average correction amount at a distance of ±60 mm from the center of a photomask is ±0.75 µm.

Next, the result of a test on how much streak irregularity occurs in a liquid crystal display apparatus (example) manufactured using the photomask designed in the example (mask correction amount) of FIG. 13, and in a liquid crystal display apparatus (comparative example) manufactured using a conventionally designed photomask (the mask correction amount is zero over the entire mask), will be described.

Figure 14:
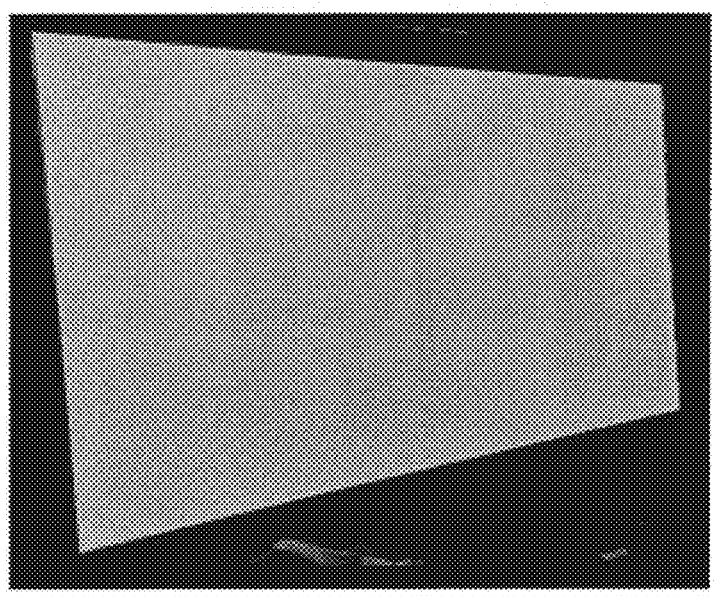
FIG. 14(a) is a photograph showing an on-state of a liquid crystal display apparatus of a comparative example, and FIG. 14(b) a photograph showing an on-state of a liquid crystal display apparatus of an example.
Figure 14:
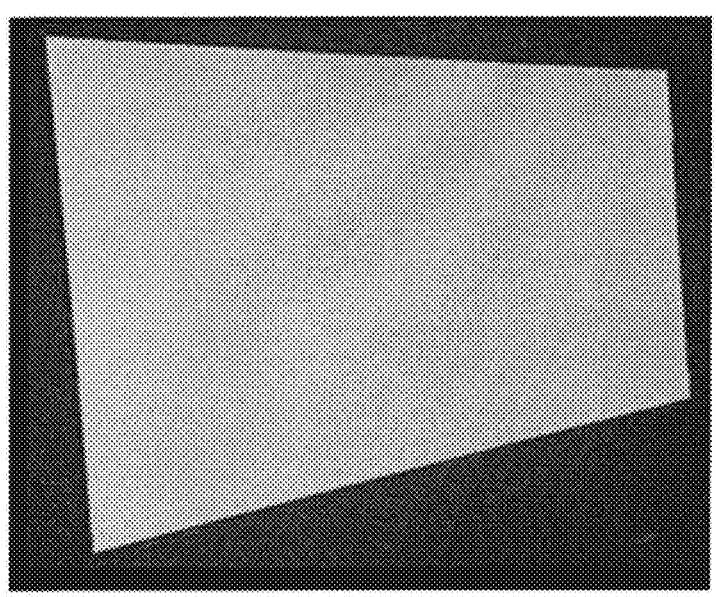

FIGS. 14(a) and 14(b) are photographs showing on-states (the state in which all pixels are displaying white) of the liquid crystal display apparatus of the comparative example and the liquid crystal display apparatus of the example, respectively. As shown in FIG. 14(a), in the liquid crystal display apparatus of the comparative example, streak irregularity extending vertically occurs. In contrast to this, as shown in FIG. 14(b), in the liquid crystal display apparatus of the example, the occurrence of streak irregularity is prevented or reduced.

Figure 15:
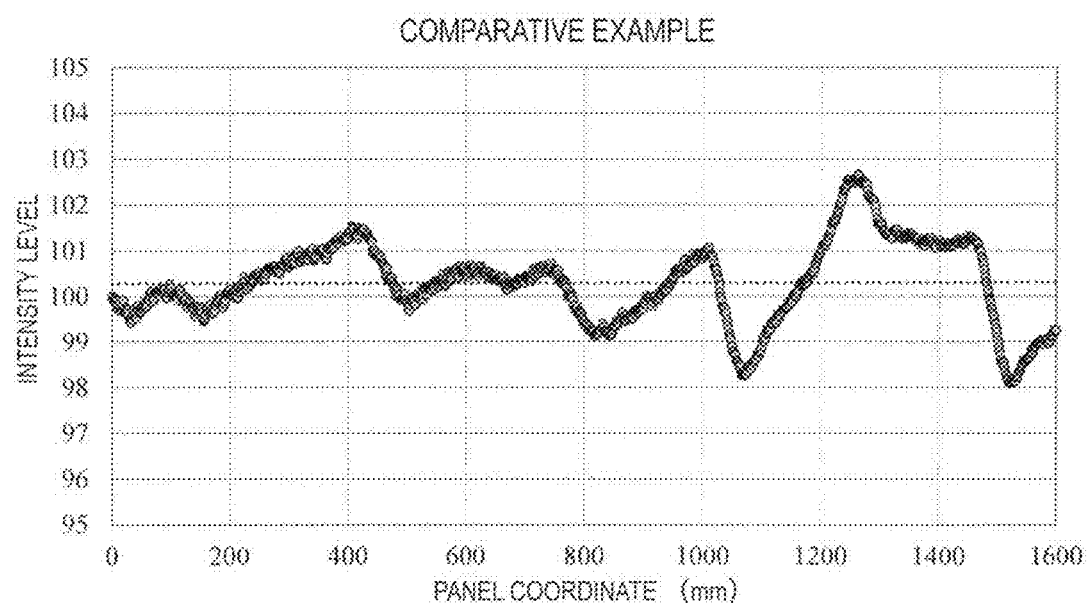
FIG. 15(a) is a graph showing a luminance level distribution of the liquid crystal display apparatus of the comparative example in the on-state.
FIG. 15(b) is a graph showing a luminance level distribution of the liquid crystal display apparatus of the example in the on-state.
Figure 15:
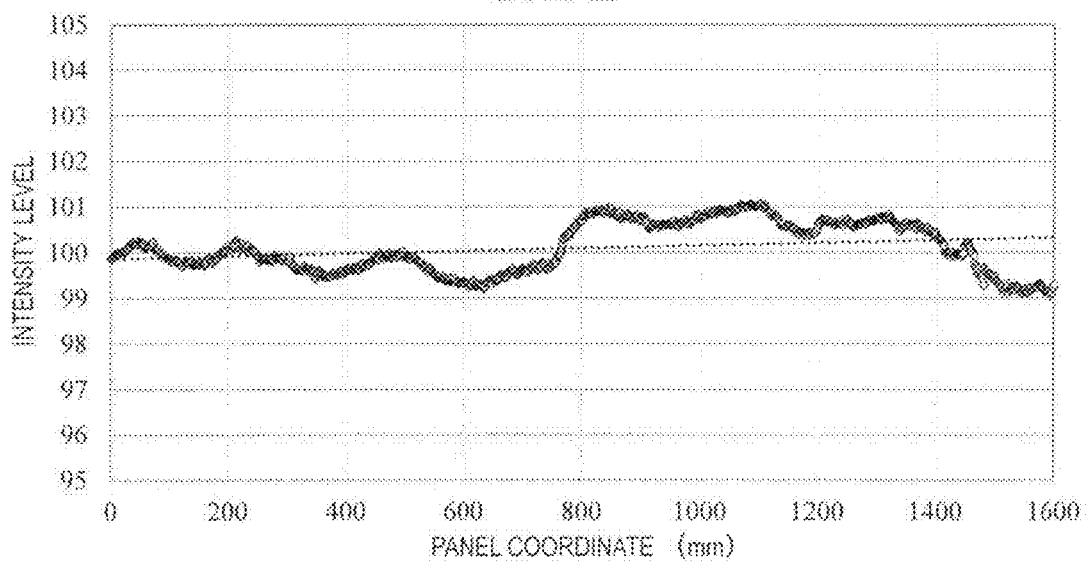

FIGS. 15(a) and 15(b) are graphs showing luminance level distributions of the liquid crystal display apparatus of the comparative example and the liquid crystal display apparatus of the example, respectively, in the on-state. In FIGS. 15(a) and 15(b), the horizontal axis represents a panel coordinate (the position of a pixel in the horizontal direction), and the vertical axis represents a luminance level.

As can be seen from FIGS. 15(a) and 15(b), variations in luminance level are further prevented or reduced in the liquid crystal display apparatus of the example than in the liquid crystal display apparatus of the comparative example. Since variations in luminance level cause streak irregularity, the prevention or reduction of variations in luminance level means the prevention or reduction of streak irregularity.

Note that of the correction amounts described above with reference to FIG. 13, the maximum correction amount of ±1.95 µm has the greatest effect of preventing or reducing the occurrence of streak irregularity.

Other Embodiments

Figure 4:
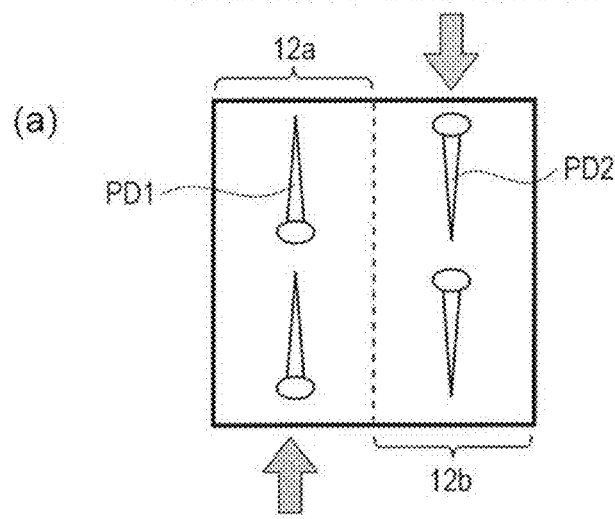
FIGS. 4(a), 4(b), and 4(c) are diagrams for describing a method for obtaining an alignment division structure of the pixel P of FIG. 3.
Figure 4:
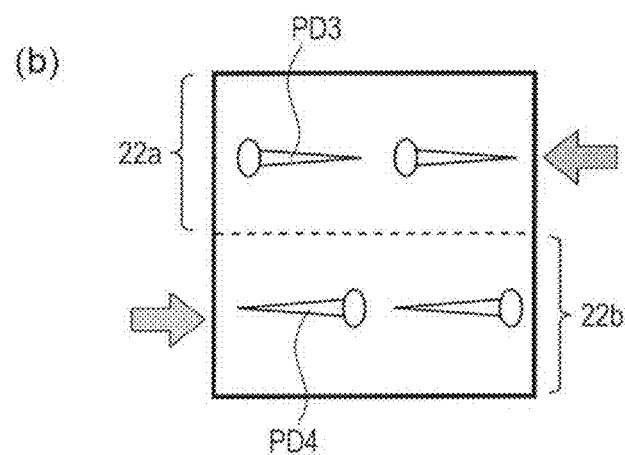
Figure 4:
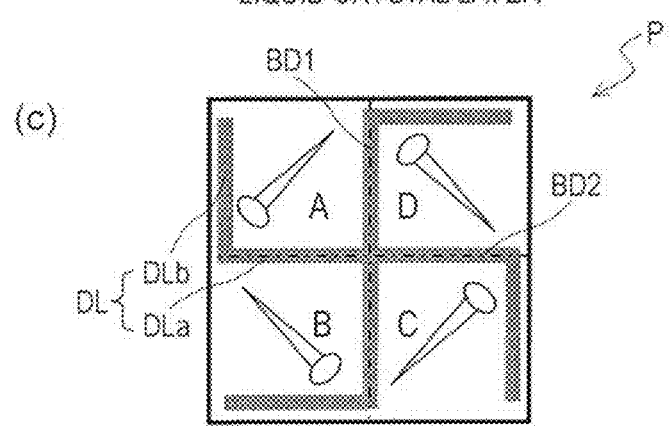

The method of alignment-dividing the pixel P into the four liquid crystal domains A-D (the arrangement of the liquid crystal domains A-D in the pixel P) is not limited to the examples of FIG. 4, etc.

Figure 16:
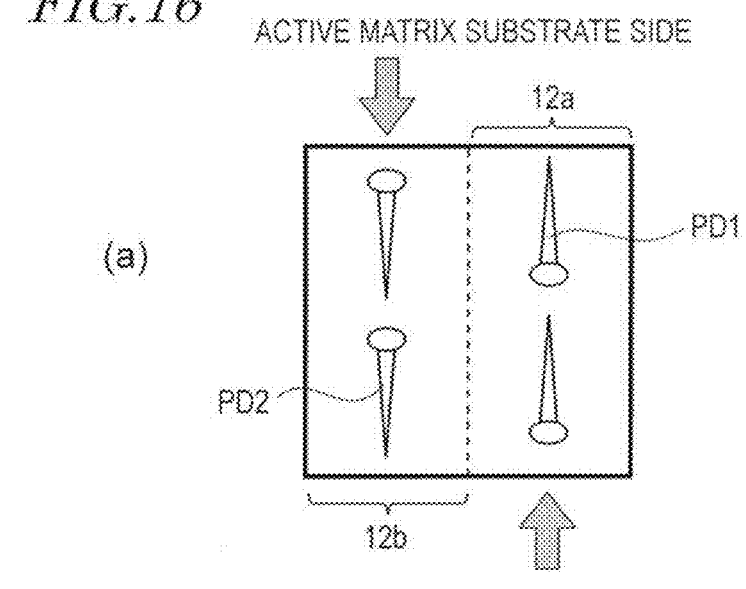
FIGS. 16(a), 16(b), and 16(c) are diagrams for describing a method for obtaining another example alignment division structure.
Figure 16:
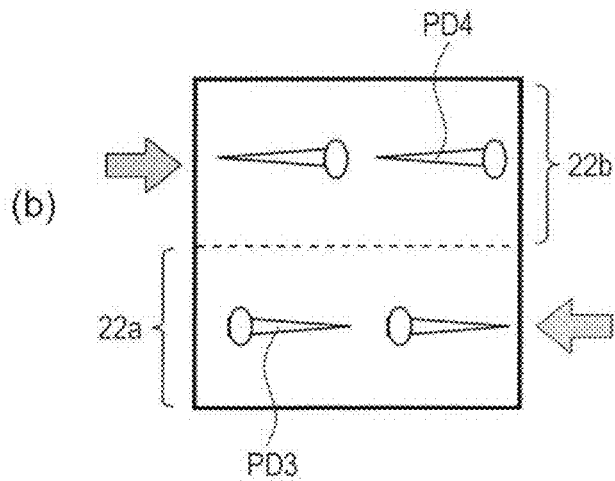
Figure 16:
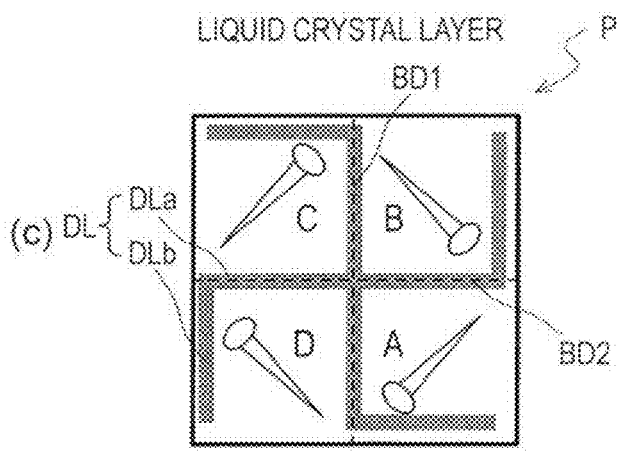

For example, an alignment division pixel P as shown in FIG. 16(c) can be formed by attaching together an active matrix substrate 10 and a counter substrate 20 that have been subjected to an alignment treatment as shown in FIGS. 16(a) and 16(b). The pixel P of FIG. 16(c) has four liquid crystal domains A-D as with the pixel P of FIG. 4.

While the liquid crystal domains A-D in the pixel P of FIG. 4 are located at the upper left, lower left, lower right, and upper right quadrants in this order (i.e., counterclockwise from the upper left quadrant). In the pixel P of FIG. 16(c), the liquid crystal domains A-D are located at the lower right, upper right, upper left, and lower left quadrants in this order (i.e., counterclockwise from the lower right quadrant). This is because the left and right regions of the active matrix substrate 10 and the upper and lower regions of the counter substrate 20 each have opposite pretilt directions between the pixel P of FIG. 4 and the pixel P1 of FIG. 16(c). In the pixel P of FIG. 16(c), dark lines DL together form a left-facing swastika shape.

Although the examples in which four liquid crystal domains are formed in a pixel have been described above, the number of liquid crystal domains formed in a pixel is not limited to four. For example, two liquid crystal domains may be formed in a pixel, or eight liquid crystal domains may be formed in a pixel.

INDUSTRIAL APPLICABILITY

A liquid crystal display apparatus manufactured by a manufacturing method according to an embodiment of the present invention is suitably used in applications such as a television set in which high-quality display is required.

REFERENCE SIGNS LIST

1 TFT
2 scan line
3 signal line
4 auxiliary capacitive line
5 gate electrode
6 source electrode
7 drain electrode
7' coupling portion
8 auxiliary capacitive electrode
9 auxiliary capacitive counter electrode
10 active matrix substrate
10a substrate
10M mother substrate
11 pixel electrode
12 first photoalignment film
12a first alignment region
12b second alignment region
20 counter substrate
20a substrate
21 counter electrode
22 second photoalignment film
22a third alignment region
22b fourth alignment region
30 liquid crystal layer
41 polarizing plate
42 polarizing plate
51 first photomask
52 second photomask
100 liquid crystal display apparatus
101 liquid crystal display panel
102 backlight
200 exposure device
201 exposure unit
201A light source housing
201B optical system housing
202 light source
203 elliptical mirror
204 mirror 205 window member
206 mirror
207 fly's eye lens
208 cylindrical lens
209 capacitor lens
210 polarizing plate
211 window member
BD1 first domain boundary
BD2 second domain boundary
Da transport direction
Db array direction
P pixel
PD1 first pretilt direction
PD2 second pretilt direction
PD3 third pretilt direction
PD4 fourth pretilt direction
SR light-blocking portion
TR light-transmitting portion

The invention claimed is:

1. A manufacturing method for a liquid crystal display apparatus, wherein the liquid crystal display apparatus includes
a plurality of pixels arranged in a matrix,
a first and a second substrate facing each other, and
a vertical alignment type liquid crystal layer provided between the first and second substrates,
the first substrate includes a pixel electrode provided for each of the plurality of pixels, and a first photoalignment film provided between the pixel electrode and the liquid crystal layer,
the second substrate has a counter electrode facing the pixel electrode, and a second photoalignment film provided between the counter electrode and the liquid crystal layer,
the plurality of pixels each include a plurality of liquid crystal domains having different reference alignment directions defined by the first and second photoalignment films,
the plurality of liquid crystal domains include a first and a second liquid crystal domain adjacent to each other with a first domain boundary extending in parallel to a first direction interposed therebetween,
the first photoalignment film includes a first and a second alignment region that define different pretilt directions in each of the plurality of pixels, and are adjacent to each other with the first domain boundary interposed therebetween, and
the manufacturing method for the liquid crystal display apparatus comprises:
a step (A) of preparing the first substrate including the pixel electrode and the first photoalignment film that has not been subjected to an alignment treatment; and
a step (B) of exposing a region of the first photoalignment film which is to serve as the first alignment region through a plurality of first photomasks, while transporting the prepared first substrate in a predetermined transport direction, the plurality of first photomasks including two or more first photomasks arranged in a second direction intersecting the transport direction,
wherein the plurality of first photomasks each include a plurality of pairs of a light-transmitting portion that transmits exposure light for exposing a region of the first photoalignment film which is to serve as the first alignment region, and a light-blocking portion that blocks light toward a region of the first photoalignment film which is to serve as the second alignment region, and the plurality of pairs are aligned in the second direction, and
the plurality of first photomasks are each designed so that in the step (B), on a side closer to one end in the second direction of the first photomask, a boundary between the light-transmitting portion and the light-blocking portion is offset from the first domain boundary toward the one end, and on a side closer to the other end in the second direction of the first photomask, the boundary between the light-transmitting portion and the light-blocking portion is offset from the first domain boundary toward the other end.

2. The manufacturing method of claim 1, wherein
the plurality of first photomasks are each designed so that in the step (B), the offset of the boundary between the light-transmitting portion and the light-blocking portion from the first domain boundary increases as the boundary moves from a center of the first photomask toward the one end, and the offset of the boundary between the light-transmitting portion and the light-blocking portion from the first domain boundary increases as the boundary moves from the center of the first photomask toward the other end.

3. The manufacturing method of claim 1, wherein
in the step (B), the exposure light is guided to the plurality of first photomasks by respective corresponding optical systems.

4. The manufacturing method of claim 1, wherein
the plurality of first photomasks form a first and a second mask columns adjacent to each other in the transport direction, and
the plurality of first photomask are further arranged so that in the step (B), the first photoalignment film includes a mask joint portion which is exposed through both a portion of one first photomask in the first mask column and a portion of one first photomask in the second mask column.

5. The manufacturing method of claim 1, further comprising:
a step (C) of exposing a region of the first photoalignment film which is to serve as the second alignment region through a plurality of second photomasks including two or more second photomasks arranged in a second direction intersecting the transport direction, while transporting the first substrate in the transport direction,
wherein the plurality of second photomasks each include a plurality of pairs of a light-transmitting portion that transmits exposure light for exposing a region of the first photoalignment film which is to serve as the second alignment region, and a light-blocking portion that blocks light toward a region of the first photoalignment film which is to serve as the first alignment region, and the plurality of pairs are aligned in the second direction, and
the plurality of second photomasks are each designed so that in the step (C), on a side closer to one end in the second direction of the second photomask, a boundary between the light-transmitting portion and the light-blocking portion is offset from the first domain boundary toward the one end, and on a side closer to the other end in the second direction of the second photomask, the boundary between the light-transmitting portion and the light-blocking portion is offset from the first domain boundary toward the other end.

6. The manufacturing method of claim 1, wherein
the plurality of liquid crystal domains include a third and a fourth liquid crystal domain adjacent to the first and second liquid crystal domains, respectively, with a second domain boundary extending so as to intersect the first domain boundary interposed therebetween.

7. The manufacturing method of claim 6, wherein
the second photoalignment film includes, in each of the plurality of pixels, a third and a fourth alignment region that define different pretilt directions, and are adjacent to each other with the second domain boundary interposed therebetween.

8. A photomask for use in an exposure step in a manufacturing method for a liquid crystal display apparatus, wherein the liquid crystal display apparatus includes
a plurality of pixels arranged in a matrix,
a first and a second substrate facing each other, and
a vertical alignment type liquid crystal layer provided between the first and second substrates,
the first substrate includes a pixel electrode provided for each of the plurality of pixels, and a first photoalignment film provided between the pixel electrode and the liquid crystal layer,
the second substrate includes a counter electrode facing the pixel electrode, and a second photoalignment film provided between the counter electrode and the liquid crystal layer,
the plurality of pixels each include a plurality of liquid crystal domains having different reference alignment directions defined by the first and second photoalignment films,
the plurality of liquid crystal domains include a first and a second liquid crystal domain adjacent to each other with a first domain boundary extending in parallel to a first direction interposed therebetween,
the first photoalignment film includes a first and a second alignment region that define different pretilt directions in each of the plurality of pixels, and are adjacent to each other with the first domain boundary interposed therebetween, and the exposing step includes exposing a region of the first photoalignment film which is to serve as the first alignment region through a plurality of photomasks, while transporting the first substrate in a predetermined transport direction, the plurality of photomasks including two or more photomasks arranged in a second direction intersecting the transport direction, and
the photomask comprises a plurality of pairs of a light-transmitting portion that transmits exposure light for exposing a region of the first photoalignment film which is to serve as the first alignment region, and a light-blocking portion that blocks light toward a region of the first photoalignment film which is to serve as the second alignment region, and the plurality of pairs are aligned in the second direction, and
the photomask is designed so that in the exposure step, on a side closer to one end in the second direction of the photomask, a boundary between the light-transmitting portion and the light-blocking portion is offset from the first domain boundary toward the one end, and on a side closer to the other end in the second direction of the photomask, the boundary between the light-transmitting portion and the light-blocking portion is offset from the first domain boundary toward the other end.

9. The photomask of claim 8, wherein
the photomask is designed so that in the exposure step, the offset of the boundary between the light-transmitting portion and the light-blocking portion from the first domain boundary increases as the boundary moves from a center of the photomask toward the one end, and the offset of the boundary between the light-transmitting portion and the light-blocking portion from the first domain boundary increases as the boundary moves from the center of the photomask toward the other end.

\* \* \* \* \*